(12) United States Patent
Lin et al.

(10) Patent No.: US 12,364,067 B2
(45) Date of Patent: Jul. 15, 2025

(54) SEMICONDUCTOR DEVICE

(71) Applicant: EPISTAR CORPORATION, Hsinchu (TW)

(72) Inventors: Chun-Yu Lin, Hsinchu (TW); Jun-Yi Li, Hsinchu (TW); Yi-Yang Chiu, Hsinchu (TW); Chun-Wei Chang, Hsinchu (TW); Yi-Ming Chen, Hsinchu (TW); Chang-Hsiu Wu, Hsinchu (TW); Wen-Luh Liao, Hsinchu (TW); Chen Ou, Hsinchu (TW); Wei-Wun Jheng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 566 days.

(21) Appl. No.: 17/860,749

(22) Filed: Jul. 8, 2022

(65) Prior Publication Data

US 2023/0010081 A1    Jan. 12, 2023

(30) Foreign Application Priority Data

Jul. 9, 2021 (TW) .............................. 110125375

(51) Int. Cl.
*H10H 20/832* (2025.01)
*H10H 20/82* (2025.01)
*H10H 20/831* (2025.01)
*H10H 20/833* (2025.01)
*H10H 20/84* (2025.01)

(52) U.S. Cl.
CPC .......... *H10H 20/835* (2025.01); *H10H 20/82* (2025.01); *H10H 20/8316* (2025.01); *H10H 20/833* (2025.01); *H10H 20/84* (2025.01)

(58) Field of Classification Search
CPC .... H10H 20/835; H10H 20/833; H10H 20/84; H10H 20/8316; H10H 20/82
See application file for complete search history.

(56) References Cited

U.S. PATENT DOCUMENTS

| | | | |
|---|---|---|---|
| 10,109,696 B2 * | 10/2018 | Zhang | H10K 59/1216 |
| 10,580,937 B2 | 3/2020 | Lin et al. | |
| 2019/0288156 A1 * | 9/2019 | Chaji | H01L 25/167 |
| 2019/0386174 A1 | 12/2019 | Wang et al. | |
| 2021/0159445 A1 * | 5/2021 | Sim | H10K 50/818 |
| 2022/0102604 A1 * | 3/2022 | Do | H10H 20/857 |

* cited by examiner

*Primary Examiner* — Mark W Tornow
(74) *Attorney, Agent, or Firm* — Muncy, Geissler, Olds & Lowe, P.C.

(57) ABSTRACT

A semiconductor device includes a semiconductor stack, a third semiconductor structure, a dielectric layer, and a reflective layer under the third semiconductor structure. The semiconductor stack includes a first semiconductor structure, an active structure, a second semiconductor structure. The first semiconductor structure has a first surface which includes a first portion and a second portion, and the first surface has a first area. The third semiconductor structure connects to the first portion, and has a second surface with a second area. The dielectric layer connects to the second portion and includes a plurality of openings, and the plurality of openings have a third area. A ratio of the second area to the first area is between 0.1~0.7, and a ratio of the third area to the first area is less than 0.2.

20 Claims, 15 Drawing Sheets

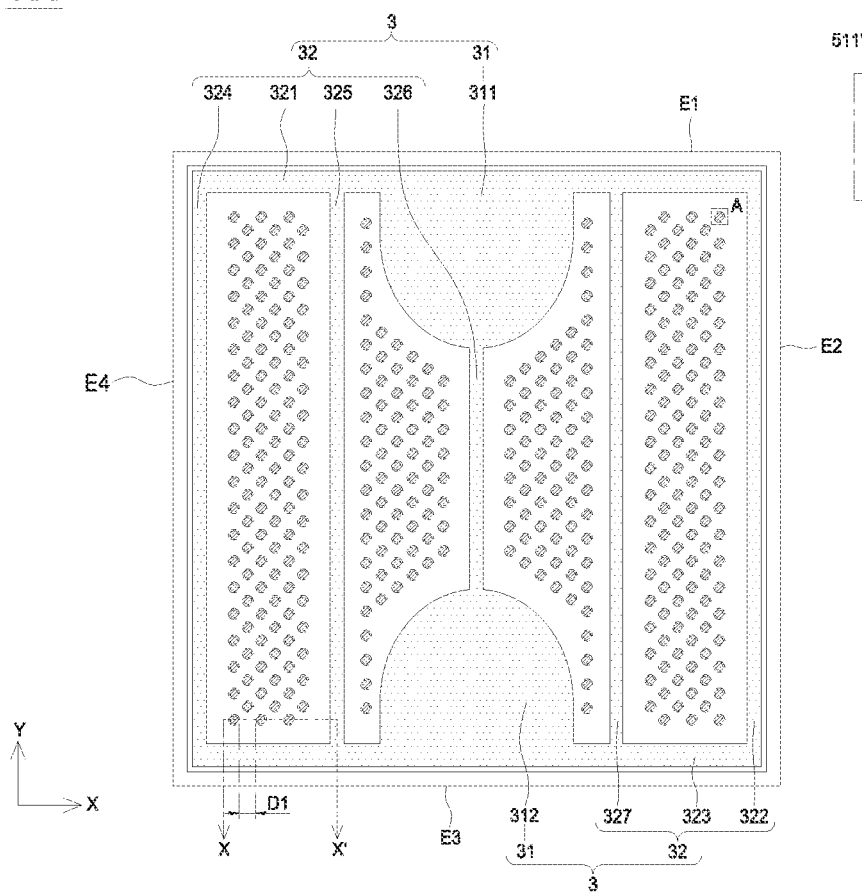
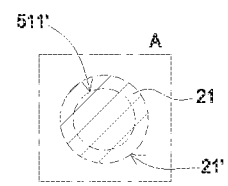
FIG. 1B
FIG. 1A
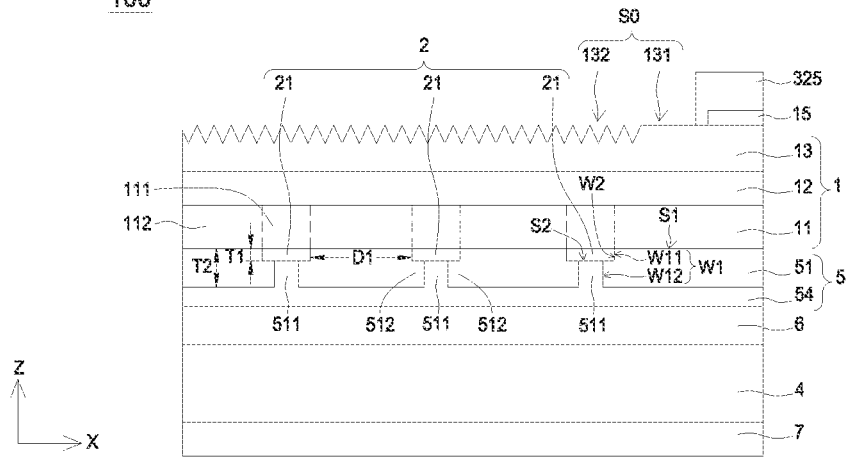
FIG. 1C

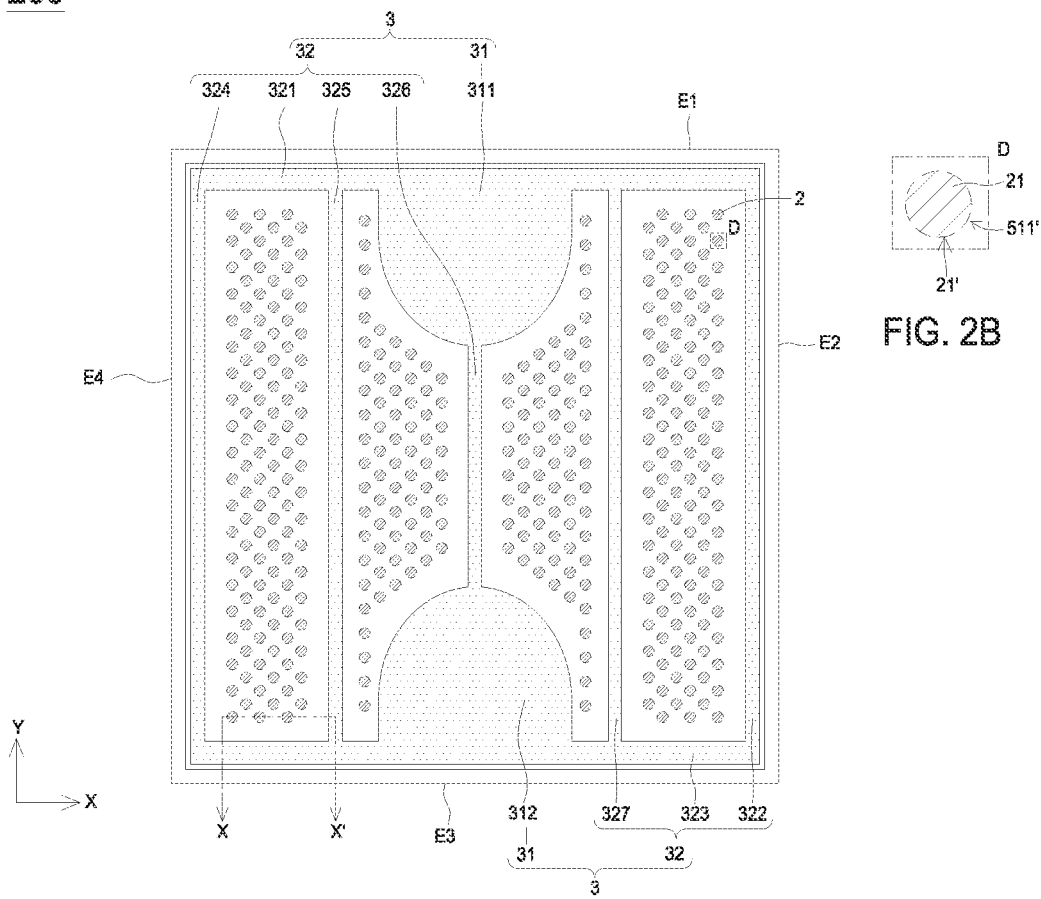
FIG. 2A
FIG. 2B
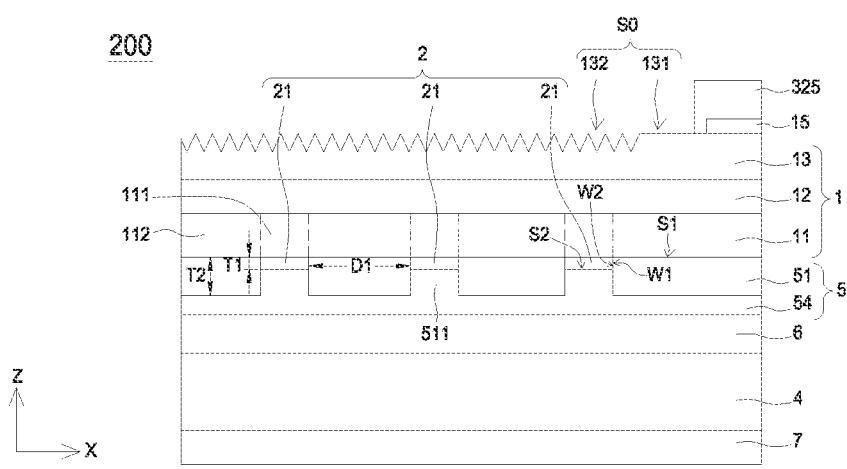
FIG. 2C

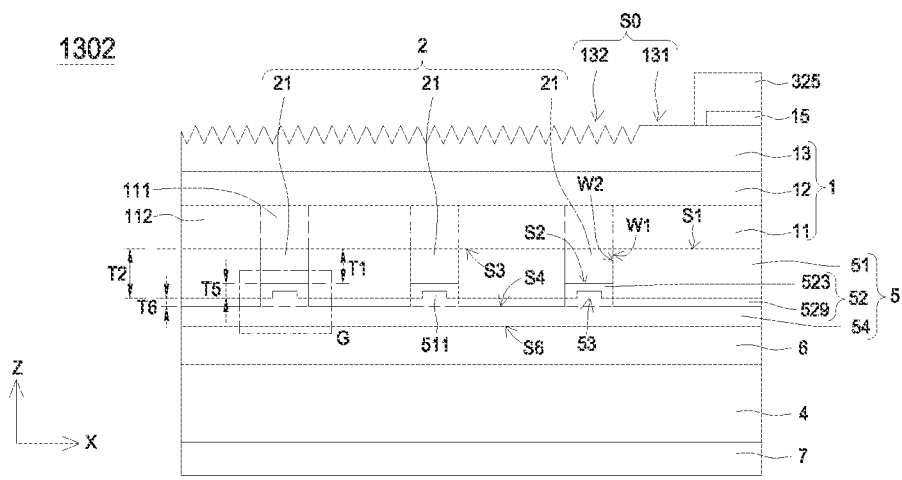
FIG. 13C
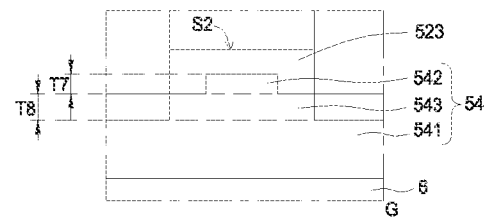
FIG. 13D
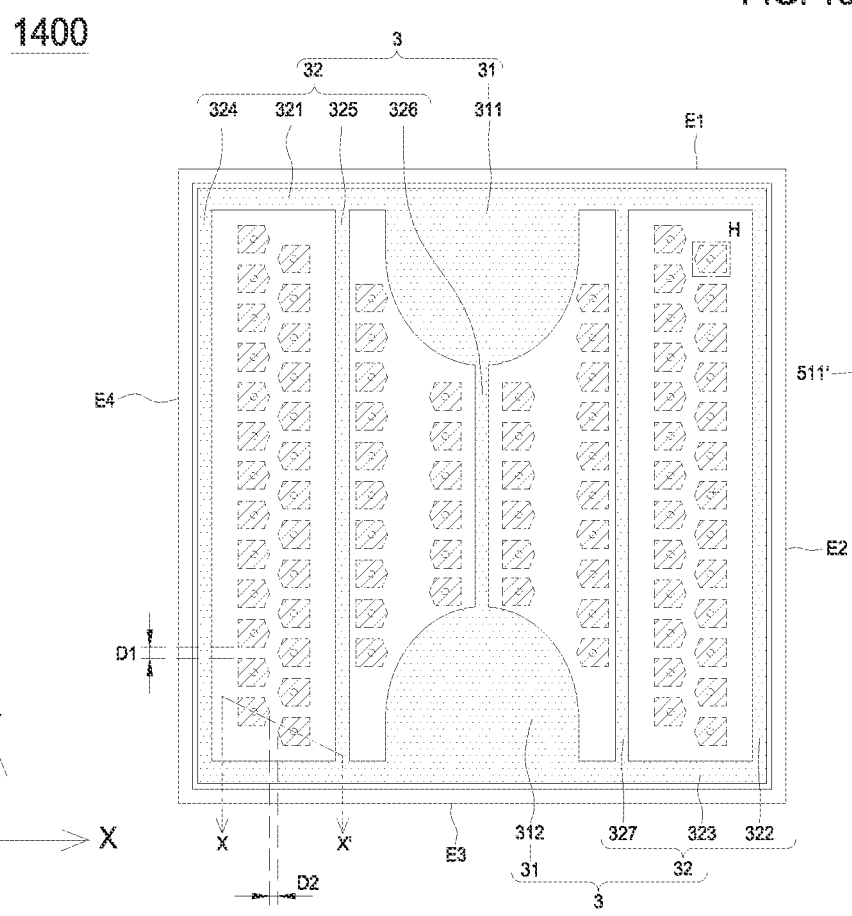
FIG. 14A
FIG. 14B

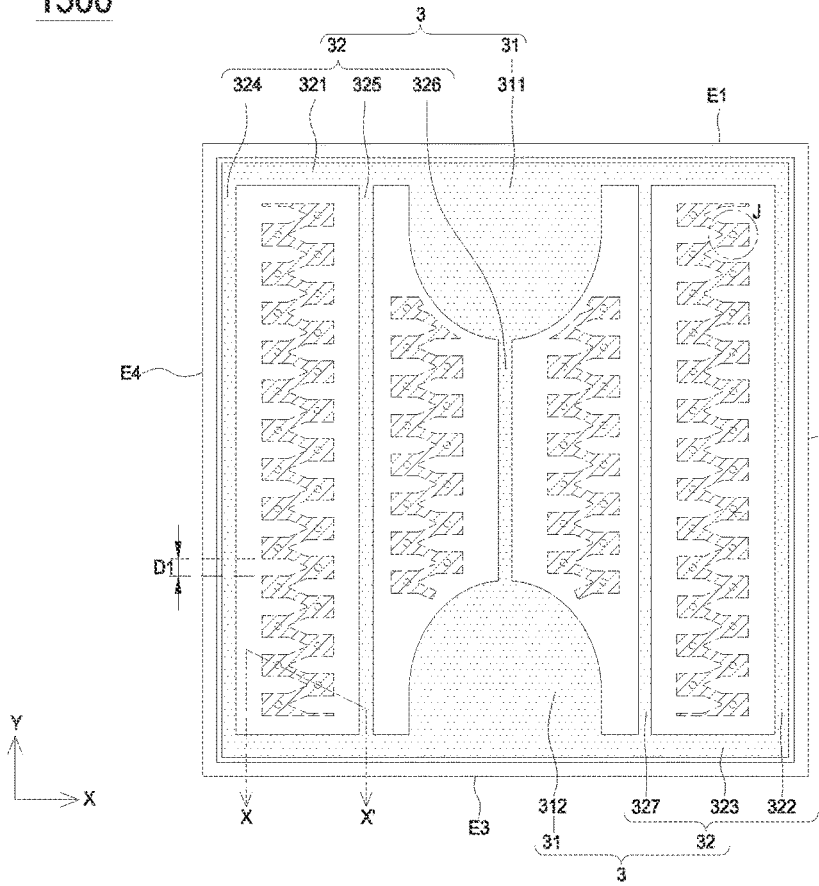
FIG. 15A
FIG. 15B
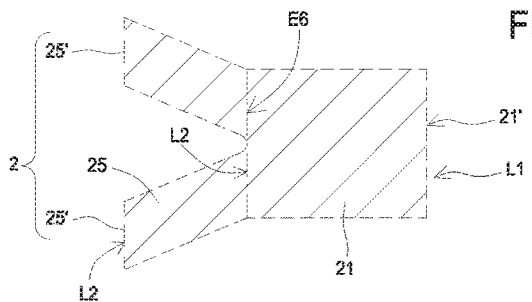
FIG. 15C
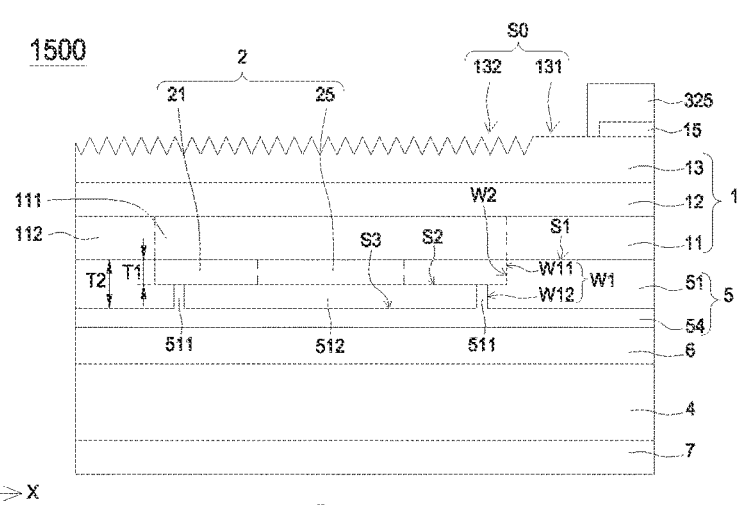
FIG. 15D

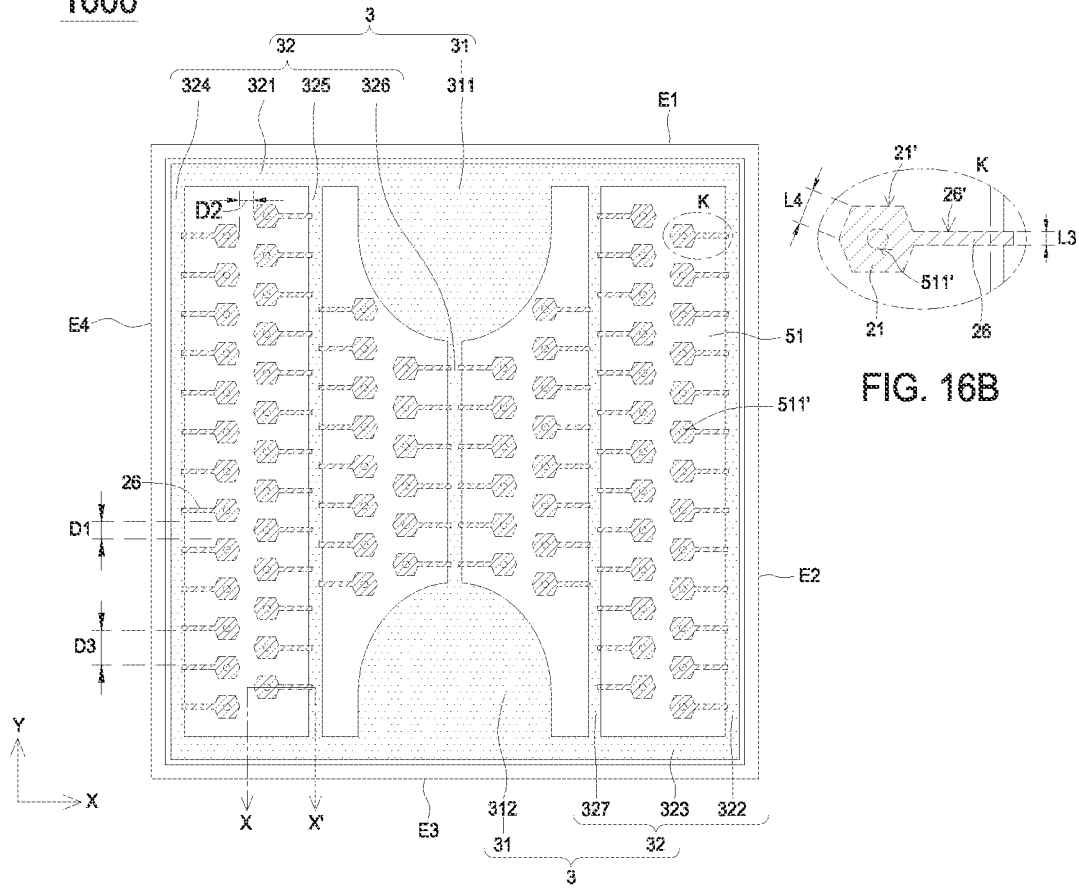
FIG. 16A
FIG. 16B
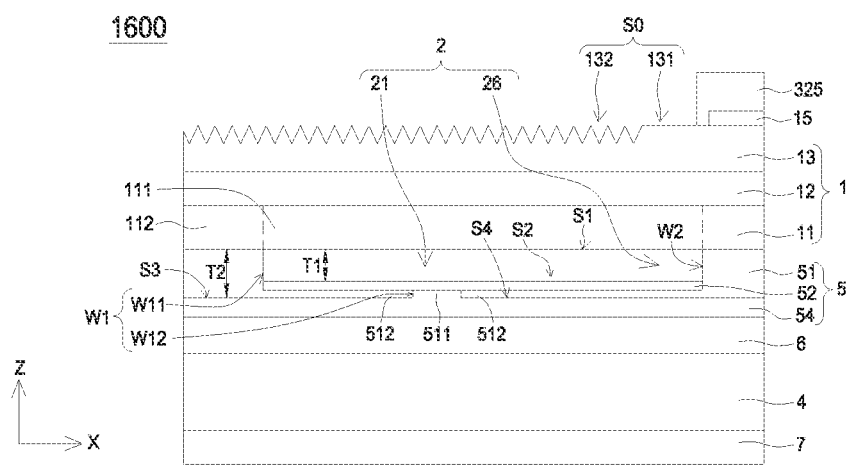
FIG. 16C

SEMICONDUCTOR DEVICE

TECHNICAL FIELD

The disclosure relates to a semiconductor device, and particularly to a semiconductor device with an active structure, a first semiconductor structure and a second semiconductor structure.

CROSS REFERENCE TO RELATED APPLICATION

This application claims the right of priority based on TW Application Serial No. 110125375, filed on Jul. 9, 2021, and the content of which is hereby incorporated by reference in its entirety.

DESCRIPTION OF BACKGROUND ART

Semiconductor electronic devices had been extensively adopted in daily life. III-V compound semiconductor, such as GaP, GaAs or GaN, has favorable photoelectric characteristics for integrated circuit (IC), light-emitting diode (LED), laser diode, or photodetector. For LED, the conventional structure includes a p-type semiconductor layer, an active structure and an n-type semiconductor layer that are stacked together, and the p-type semiconductor layer and the n-type semiconductor layer are formed by process design (e.g., doping process). Under an external electrical power supply, the n-type semiconductor layer and p-type semiconductor layer provide electrons and holes respectively to be recombined in the active structure and to be further converted into light.

SUMMARY OF THE DISCLOSURE

The present disclosure provides a semiconductor device. The semiconductor device includes a semiconductor stack, a third semiconductor structure, a dielectric layer and a reflecting layer. The semiconductor stack includes a first semiconductor structure, an active structure and a second semiconductor structure. The first semiconductor structure has a first surface which further comprises a first portion and a second portion, and the first surface has a first area. The third semiconductor structure connects to the first portion of the first semiconductor structure and has a second surface with a second area. The dielectric layer connects to the second portion and comprises a plurality of openings, and the openings have a third area. The reflecting layer located under the third semiconductor structure. A ratio of the second area to the first area is 0.1 to 0.7, and a ratio of the third area to the first area less than 0.2.

BRIEF DESCRIPTION OF THE DRAWINGS

The foregoing aspects and many of the attendant advantages of the present disclosure will become more readily appreciated as the same becomes better understood by reference to the following detailed description, when taken in conjunction with the accompanying drawings, wherein:

FIG. 1A shows a top view of the semiconductor device disclosed in one embodiment in accordance with the present disclosure;

FIG. 1B shows an enlarged view of region A in FIG. 1A;

FIG. 1C shows a cross-sectional view along X-X' line in FIG. 1A;

FIG. 2A shows a top view of the semiconductor device disclosed in one embodiment in accordance with the present disclosure;

FIG. 2B shows an enlarged view of region D in FIG. 2A;

FIG. 2C shows a cross-sectional view along X-X' line in FIG. 2A;

FIG. 13C shows a cross-sectional view of the semiconductor device disclosed in one embodiment in accordance with the present disclosure;

FIG. 13D shows an enlarged view of region G in FIG. 13C;

FIG. 14A shows a top view of the semiconductor device disclosed in one embodiment in accordance with the present disclosure;

FIG. 14B shows an enlarged view of region H in FIG. 14A;

FIG. 15A shows a top view of the semiconductor device disclosed in one embodiment in accordance with the present disclosure;

FIG. 15B shows an enlarged view of region I in FIG. 15A;

FIG. 15C shows an enlarged view of element 2 in FIG. 15A;

FIG. 15D shows a cross-sectional view along X-X' line in FIG. 15A;

FIG. 16A shows a top view of the semiconductor device disclosed in one embodiment in accordance with the present disclosure;

FIG. 16B shows an enlarged view of region J in FIG. 16A;

FIG. 16C shows a cross-sectional view along X-X' line in FIG. 16A.

DETAILED DESCRIPTION OF PREFERRED EMBODIMENTS

Figure 1D:
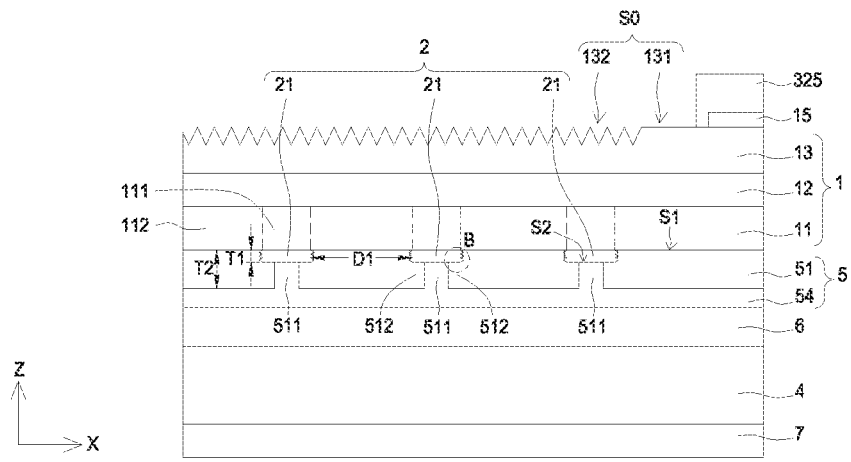
FIG. 1D shows a cross-sectional view of the semiconductor device disclosed in one embodiment in accordance with the present disclosure.

Exemplary embodiments of the present disclosure will be described in detail with reference to the accompanying drawings hereafter. The following embodiments are given by way of illustration with Cartesian Coordinates (X, Y, Z axes) to help those skilled in the art fully understand the spirit of the present disclosure. Hence, it should be noted that the present disclosure is not limited to the embodiments herein and can be realized in various forms. Further, the drawings are not precise scale and components may be exaggerated in view of width, height, length, etc. Herein, the similar or identical reference numerals will denote the similar or identical components throughout the drawings. In the embodiments of the present disclosure, if not described otherwise, the term "horizontal" means any value or vector along X-axis, Y-axis or on X-Y plane. The term "vertical" means any value or vector along Z-axis, and terms such as "below", "above", "under", "on", "top" and "bottom" may be used to describe special relationships along Z-axis between different devices or elements. The term "corresponding" may be used to describe different elements are overlapped horizontally (on X-Y plane). The term "coplanar" may be used to describe surfaces of different elements are vertically on the same level.

FIGS. 1A and 1B respectively show a top view and an enlarged view of a semiconductor device 100 in one embodiment in accordance with the present disclosure, and FIG. 1C shows a cross-sectional view of the semiconductor device 100 along X-X' line shown in FIG. 1A. The semiconductor device 100 can be implemented in any shapes, such as polygon, circle and irregular shape. In this embodiment, the shape of the semiconductor device 100 is rectangle and includes a first edge E1, a second edge E2, a third edge E3, and a fourth edge E4. The first edge E1 and the third edge E3 connect to the second edge E2 and the fourth edge E4. The first edge E1 corresponds and can be parallel to the third edge E3, and the second edge E2 corresponds and can be parallel to the fourth edge E4.

Referring to FIGS. 1A and 1C, the semiconductor device 100 includes a semiconductor stack 1 which further includes a first semiconductor structure 11 and a second semiconductor structure 13, a third semiconductor structure 2 located below the semiconductor stack 1, and a first electrode 3 located above the semiconductor stack 1. In this embodiment, the semiconductor device 100 is a light-emitting device, and the semiconductor stack 1 is a light-emitting stack. Furthermore, the semiconductor device 100 can optionally include a contact structure 15, a substrate 4, a reflecting structure 5 and a bonding layer 6. The contact structure 15 is located between the first electrode 3 and the semiconductor stack 1 and connects the first electrode 3 and the second semiconductor structure 13. The reflecting structure 5 is located between the substrate 4 and the semiconductor stack 1, and light emitted by the semiconductor stack 1 is reflected by the reflecting structure 5 toward the first electrode 3 to leave the semiconductor device 100 through an outer surface S0 of the second semiconductor structure 13. The outer surface S0 includes a flat area 131 and a rough area 132 and the rough area 132 is provided to reduce the possibility of total reflection for the light from the semiconductor stack 1. The first electrode 3 can be set on the flat area 131 of the second semiconductor structure 13. In other embodiments, the semiconductor device 100 can further includes a second electrode 7. The first electrode 3, the semiconductor stack 1, the reflecting structure 5, the bonding layer 6, the substrate 4 and the second electrode 7 are sequentially stacked, from top to bottom.

As shown in FIG. 1A, the first electrode 3 includes a plurality of electrode pads 31 and a plurality of extension electrodes 32. The electrode pads 31 connect to one or more extension electrodes 32. The electrode pads 31 include a first pad 311 and a second pad 312, and the extension electrodes 32 include a first extending section 321 nearby the first edge E1, a second extending section 322 nearby the second edge E2, a third extending section 323 nearby the third edge E3, a fourth extending section 324 nearby the fourth edge E4, a fifth extending section 325, a sixth extending section 326 and a seventh extending section 327. The sixth extending section 326 is located between the fifth extending section 325 and the seventh extending section 327. The fifth extending section 325 is located between the sixth extending section 326 and the fourth extending section 324. The seventh extending section 327 is located between the second extending section 322 and the sixth extending section 326. Besides, the second extending section 322, the fourth extending section 324, the fifth extending section 325 and the seventh extending section 327 have the same length which is longer than the length of the sixth extending section 326.

The semiconductor stack 1 can be a p-n structure or a p-i-n structure. In one embodiment, the semiconductor stack 1 can further includes an active structure 12 located between the first semiconductor structure 11 and the second semiconductor structure 13. The first semiconductor structure 11 and the second semiconductor structure 13 can be cladding layers and/or confinement layers with a bandgap larger than that of the active structure 12 in order to increase the combination possibility of electrons and holes within the active structure 12. With different materials, the active structure 12 can emit a light with peak wavelength in the range of 200~1800 nm, e.g., 700 nm~1700 nm in infrared light range, 610 nm~700 nm in red light range, 530 nm~570 nm in yellow light range, 490 nm~550 nm in green light range, 400 nm~490 nm in blue or deep blue light range, or 250 nm~400 nm in ultraviolet light range.

The first semiconductor structure 11 and the second semiconductor structure 13 can be a single-layer or multi-layer structure. The first semiconductor structure 11 and the second semiconductor structure 13 are a first conducting type and a second conducting type, respectively. The first semiconductor structure 11 and the second semiconductor structure 13 respectively provide electrons and holes, or holes and electrons. The semiconductor stack 1 can include a single heterostructure or double heterostructure. The active structure 12 can include multiple quantum wells.

In one embodiment, the reflecting structure 5 includes a dielectric layer 51 and a reflecting layer 54, and the dielectric layer 51 is located between the reflecting layer 54 and the semiconductor stack 1. As shown in FIG. 1C, the third semiconductor structure 2 is vertically (along Z-axis) located between the reflecting structure 5 and the semiconductor stack 1.

Referring to FIGS. TA, 1B and 1C, the first semiconductor structure 11 includes a first surface ST connecting the third semiconductor structure 2 and the dielectric layer 51, and the third semiconductor structure 2 has a second surface S2 which contacts the dielectric layer 51 and the reflecting layer 54. The dielectric layer 51 is located below the third semiconductor structure 2 and the first semiconductor structure 11 and contacts the third semiconductor structure 2 and the first semiconductor structure 11. Moreover, the dielectric layer 51 includes a plurality of openings 511 for partially exposing the second surface S2, and a plurality of first regions 512 located below the third semiconductor structure 2 and surrounding the openings 511. Moreover, the dielectric layer 51 includes a first sidewall W1, and the first sidewall W1 includes a first contacting wall W11 connecting to the third semiconductor structure 2 and a second contacting wall W12 defined as a sidewall of the first region 512. The third semiconductor structure 2 includes a second sidewall W2 which connects to the first contacting wall W11 and doesn't connect to the second contacting wall W12. In one embodiment, the second sidewall W2 can be perpendicular or not perpendicular to the second surface S2, and the second contacting wall W12 can be perpendicular or not perpendicular to the second surface S2. The reflecting layer 54 is located under the third semiconductor structure 2 and/or the dielectric layer 51. In one embodiment, the reflecting layer 54 fills in the openings 511 to connect the third semiconductor structure 2 and the dielectric layer 51, and further cover the second contacting wall W12 of the first region 512.

The first semiconductor structure 11 includes a plurality of first portions 111 and a plurality of second portions 112. The third semiconductor structure 2 includes a plurality of first parts 21. The first portions 111 of the first semiconductor structure 11 correspond to locations of the first parts 21, and the second portions 112 of the first semiconductor structure 11 do not correspond to locations of the first parts 21. The first parts 21 has a first thickness T1, and the dielectric layer 51 corresponding to the second portion 112 has a second thickness T2 larger than the first thickness T1.

Referring to FIGS. 1A and 1B, as projected to the X-Y plane and drawn by dashed line, the first parts 21 have a plurality of circular first part outlines 21', and the openings 511 have a plurality of circular opening outlines 511'. In FIG. 1B, one first part 21 and one opening 511 are shown. The first part outline 21' and the opening outline 511' are concentric, and a diameter of the opening outline 511' is smaller than that of the first part outline 21'. Thus, the first part outline 21' surrounds the opening outline 511'. In other embodiments, the first part outline 21' and the opening outline 511' can be other shapes sharing the same geometric center, such as triangle, square, rectangle, pentagon, hexagon or other polygons.

FIGS. TA, 1B and 1C show that, on X-Y plane, the first part outlines 21' and the opening outlines 511' are not overlapped with the first electrode 3. In other words, locations of the first part outlines 21' and the opening outlines 511' are not corresponding to the first electrode 3. Besides, there is a first distance D1 between two adjacent first part outlines 21', and the first distance D1 can be less than 20 μm, such as 2 μm, 4 μm, 6 μm, 8 μm, 10 μm, 12 μm, 14 μm, 16 μm or 18 μm.

Referring to FIGS. 1A, 1B and 1C, and the first surface S1 of the first semiconductor structure 11 has a first area A1. The second surface S2 of the third semiconductor structure 2 has a second area A2, which is the sum of areas of all the first parts 21 on X-Y plane. In other words, the second area A2 is the total area of all the first part outlines 21'. A ratio of the second area A2 to the first area A1 is between 0.1 to 0.7, such as 0.1, 0.2, 0.3, 0.4, 0.5, 0.6 or 0.7, for improving the forward voltage, which can be less than 2V when operating current is 350 mA, for instance. In one embodiment, the opening outlines 511' is circulus shape with a diameter less than or equal to 30 μm, such as 1 μm, 3 μm, 5 μm, 7 μm, 9 μm, 10 μm or 20 μm. Similarly, the total area of all the opening outlines 511' is a third area A3, and a ratio of the third area A3 to the first area A1 is less than 0.2, such as 0.02, 0.04, 0.06, 0.08, 0.1, 0.12, 0.14, 0.16 or 0.18, for improving the light-emitting power, which can be larger than 300 mW when operated at 350 mA, for example.

Figure 1E:
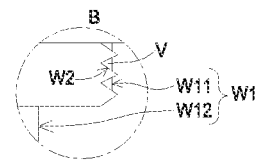
FIG. 1E shows an enlarged view of region B in FIG. 1D.

FIG. 1D shows a cross-sectional view of a semiconductor device 101 disclosed in another embodiment in accordance with present disclosure. The configuration and the components of the semiconductor device 101 in this embodiment are similar to those in the semiconductor device 100, and the difference is that one or more surfaces of the third semiconductor structure 2 are rough. Referring to FIG. 1E for a partially enlarged view of FIG. 1D, the second surface S2 and the second sidewall W2 respectively have a first surface roughness Ra1 and a second surface roughness Ra2, and the second surface roughness Ra2 is larger than the first surface roughness Ra1. Besides, the first contacting wall W11 is not completely covered or connected to the second sidewall W2, thus forms a void V therebetween. The void V can be vacuum or air-filled, and the reflectivity can be increased by the difference of refractive indices between dielectric layer 51 and the void V or between the second semiconductor structure 2 and the void V.

Figure 1F:
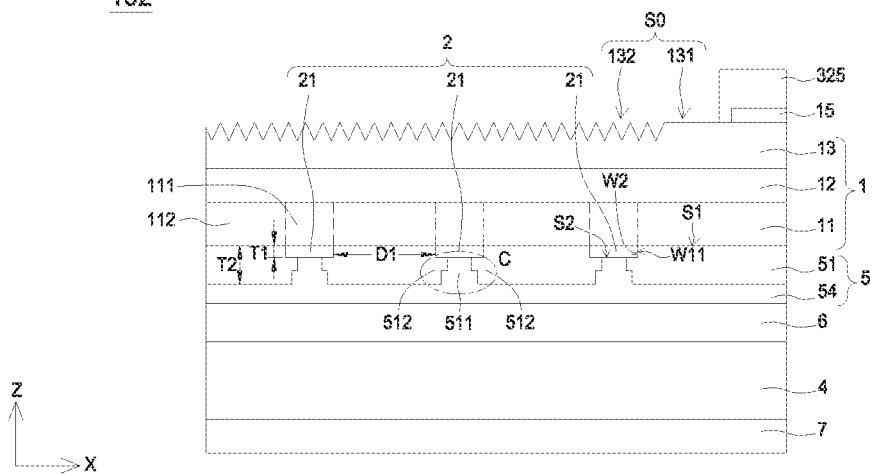
FIG. 1F shows a cross-sectional view of the semiconductor device disclosed in one embodiment in accordance with the present disclosure.
Figure 1G:
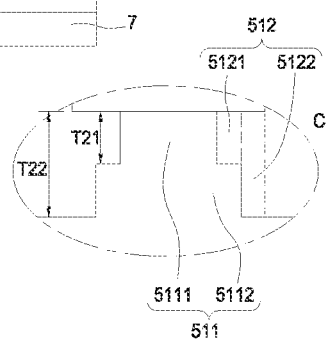
FIG. 1G shows an enlarged view of region C in FIG. 1F.

FIGS. 1F and 1G respectively shows a cross-sectional view and a partial enlarged view of a semiconductor device 102 that is similar to the semiconductor device 100. In this embodiment, each of the first regions 512 of the dielectric layer 51 is a steeped form and includes a first subregion 5121 and a second subregion 5122 connected to the first subregion 5121. Along X-axis, the second subregion 5122 is located between the first contacting wall W11 and the first subregion 5121, and a first subregion height T21 of the first subregion 5121 is smaller than a second subregion height T22 of the second subregion 5122. Besides, each of the openings 511 includes a first zone 5111 surrounded by the first subregion 5121 and a second zone 5112 surrounded by the second subregion 5122, and the first zone 5111 is located between the first parts 21 and the second zone 5112 in vertical direction (along Z-axis). Thus, the reflecting layer 54 can be filled in the first zones 5111 and the second zones 5112 to connect the first parts 21, the first subregions 5121 and the second subregions 5122.

FIGS. 2A and 2B respectively show a top view and an enlarged view of a semiconductor device 200 disclosed in one embodiment in accordance with the present disclosure, and the structure and components of the semiconductor device 200 are similar to those of the semiconductor device 100. As shown in FIG. 2B, the opening outline 511' and the first part outline 21' have the same perimeter and the same area. Thus, the third area A3 of the opening outlines 511' is approximately equal to the second area A2 of the first part outlines 21'. FIG. 2C shows a cross-sectional view along X-X' line in FIG. 2A and indicates that the dielectric layer 51 of the semiconductor device 200 does not include the first region 512. More specifically, along X-axis, the horizontal width of each of the openings 511 is equal to that of each of the first parts 21, and the first sidewall W1 of the dielectric layer 51 and the second sidewall W2 of the first part 21 are coplanar.

Figure 2D:
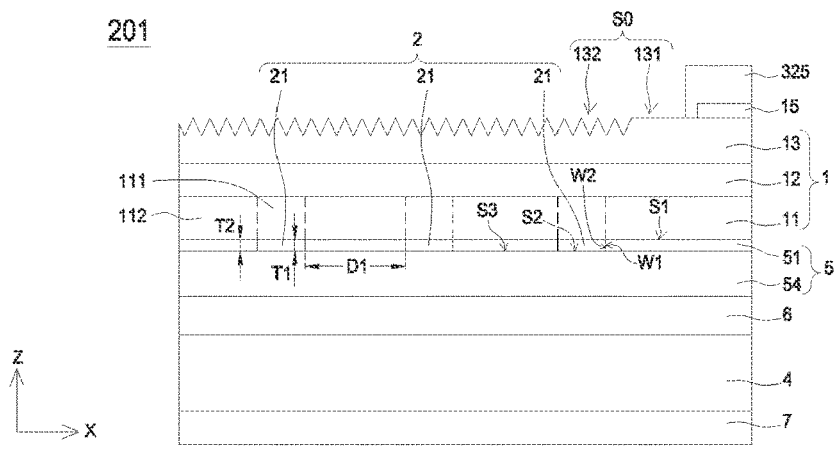
FIG. 2D shows a cross-sectional view of the semiconductor device disclosed in one embodiment in accordance with the present disclosure.

FIG. 2D shows a cross-sectional view of a semiconductor device 201 that is similar to the semiconductor device 200. In this embodiment, the dielectric layer 51 has a third surface S3, which can be coplanar with the second surface S2 of the third semiconductor structure 2 to increase the reflectivity. Besides, the first thickness T1 of the third semiconductor structure 2 is approximately equal to the second thickness T2 of the dielectric layer 51. Both the first thickness T1 and the second thickness T2 are greater than 50 Å and less than 500 Å, such as 100 Å, 200 Å, 300 Å, or 400 Å.

Figure 3A:
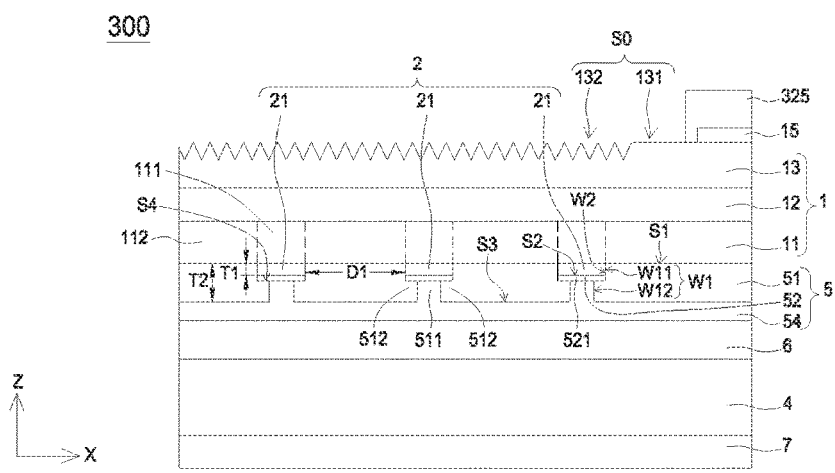
FIG. 3A shows a cross-sectional view of the semiconductor device disclosed in one embodiment in accordance with the present disclosure.

FIG. 3A shows a cross-sectional view of a semiconductor device 300 disclosed in one embodiment in accordance with the present disclosure, and the semiconductor device 300 is similar to the semiconductor device 100. In this embodiment, the reflecting structure 5 further includes a conductive structure 52 located between the first parts 21 and the reflecting layer 54 and/or between the first parts 21 and the dielectric layer 51. Thus, the conductive structure 52 connects with the first parts 21, the dielectric layer 51 and the reflecting layer 54. More specifically, the conductive structure 52 has a fourth surface S4 to connect the dielectric layer 51 and the reflecting layer 54, and the fourth surface S4 has a fourth area A4. Besides, the conductive structure 52 includes a plurality of first blocks 521 located in the openings 511 and between the first parts 21 and the reflecting layer 54, and the sum of areas of all the first blocks 521 is the fourth area A4. In this embodiment, along X-axis, the horizontal width of each of the first blocks 521 is equal to that to each of the first parts 21, so the fourth area A4 of the conductive structure 52 is approximately equal to the second area A2 of the third semiconductor structure 2. In addition, the third surface S3 of the dielectric layer 51 and the fourth surface S4 of the conductive structure 52 respectively have a third surface roughness Ra3 and a fourth surface roughness Ra4, and the third surface roughness Ra3 is smaller than the fourth surface roughness Ra4, e.g. Ra3≤2 nm and Ra4>2 nm. Thus, the reflecting layer 54 can be formed with a lower surface roughness for increasing the reflectivity.

Figure 3B:
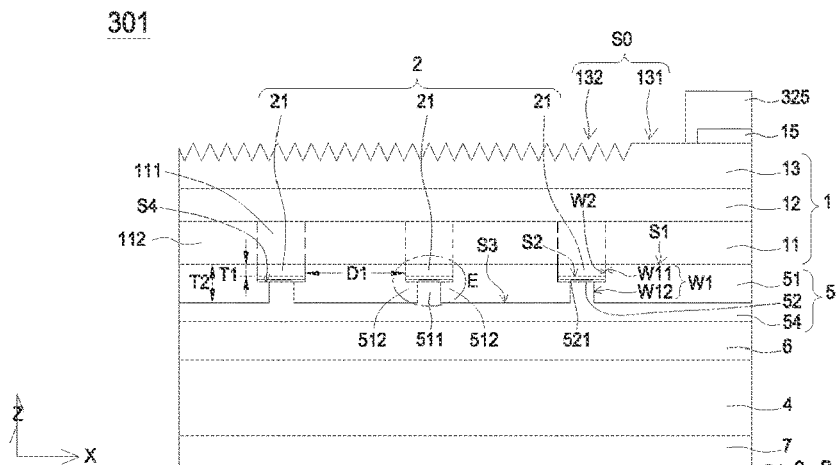
FIG. 3B shows a cross-sectional view of the semiconductor device disclosed in one embodiment in accordance with the present disclosure.
Figure 3C:
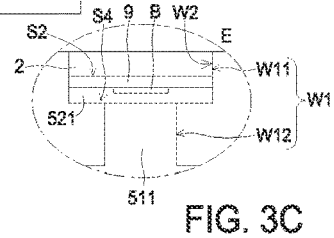
FIG. 3C shows an enlarged view of region E in FIG. 3B.

FIGS. 3B and 3C respectively show a cross-sectional view and a partially enlarged view of a semiconductor device 301 which is similar to the semiconductor device 300. In this embodiment, the semiconductor device 301 further includes a fourth semiconductor layer 9 and a barrier layer B. The fourth semiconductor layer 9 is located between the third semiconductor structure 2 and the conductive structure 52 and connects to the first contacting wall W11 of the dielectric layer 51. The fourth semiconductor layer 9 can be the same doped material as the third semiconductor structure 2, but the doping concentration of the fourth semiconductor layer 9 can be higher than that of the third semiconductor structure 2 for lowering the resistance. The doping concentration of the fourth semiconductor layer 9 is between $10^{17}/cm^3$ to $10^{22}/cm^3$, such as $10^{19}/cm^3$, $10^{20}/cm^3$ or $10^{21}/cm^3$. FIG. 3C show an enlarged view of one opening 511. The barrier layer B is located between the fourth semiconductor layer 9 and the first block 521 of the conductive structure 52, and surrounded by the first block 521 without contacting the first contacting wall W11. Thus, the barrier layer B is divided into many blocks that respectively corresponds to locations of the openings 511. Width of each block of the barrier layer B can be smaller, equal to, or larger than the width of the openings 511 (along X-axis). Through the barrier layer B, current concentration effect can be reduced to make the semiconductor stack 1 have a better light-emitting uniformity, and the reflectivity can be enhanced as well.

Figure 3D:
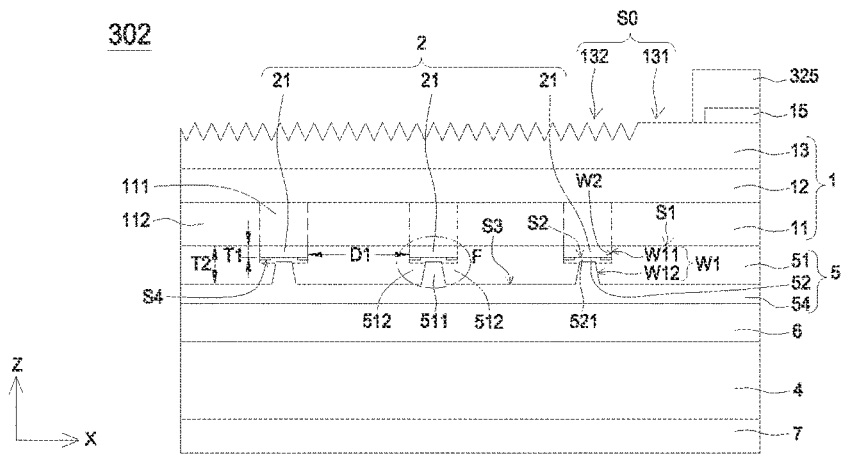
FIG. 3D shows a cross-sectional view of the semiconductor device disclosed in one embodiment in accordance with the present disclosure.
Figure 3E:
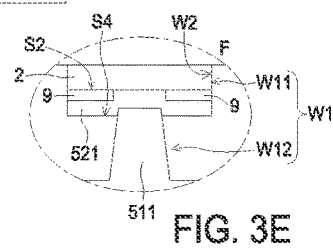
FIG. 3E shows an enlarged view of region F in FIG. 3D.

FIGS. 3D and 3E respectively show a cross-sectional view and a partially enlarged view of a semiconductor device 302 which is similar to the semiconductor device 300. In this embodiment, the semiconductor device 302 also includes the fourth semiconductor layer 9, which is patterned as a ring shape to surround a part of the first block 521 for reducing current concentration effect. The second surface S2 of the third semiconductor structure 2 connects to both the fourth semiconductor layer 9 and the conductive structure 52. In addition, the patterned fourth semiconductor layer 9 can also reduce light absorption induced by higher doping concentration thereof.

Figure 4A:
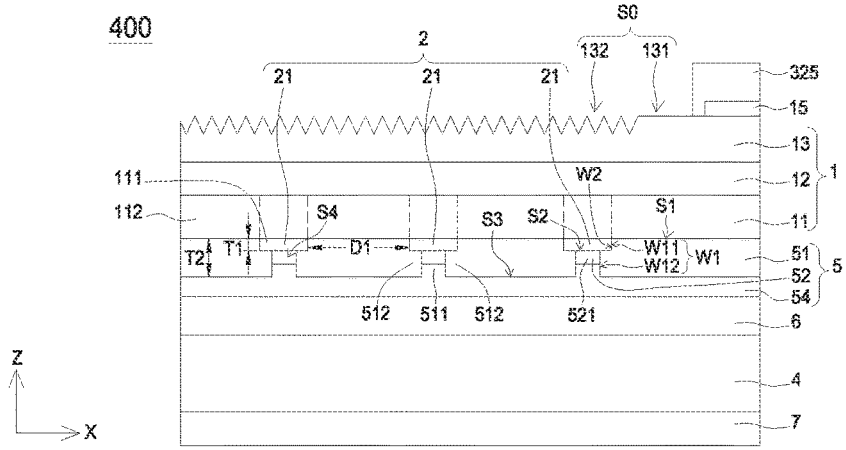
FIG. 4A shows a cross-sectional view of the semiconductor device disclosed in one embodiment in accordance with the present disclosure.

FIG. 4A shows a cross-sectional view of a semiconductor device 400 disclosed in one embodiment in accordance with the present disclosure, and the semiconductor device 400 is similar to the semiconductor device 300. In this embodiment, the first blocks 521 of the conductive structure 52 are located in the openings 511 and surrounded by the first regions 512 while the conductive structure 52 does not fully fill the openings 511 in vertical direction (along Z-axis). The width of each of the first blocks 521 is smaller than that of each of the first parts 21, thus the fourth area A4 of the conductive structure 52 is smaller than the second area A2 of the third semiconductor structure 2. However, the fourth area A4 is substantially equal to the third area A3 of the opening outlines 511'.

Figure 4B:
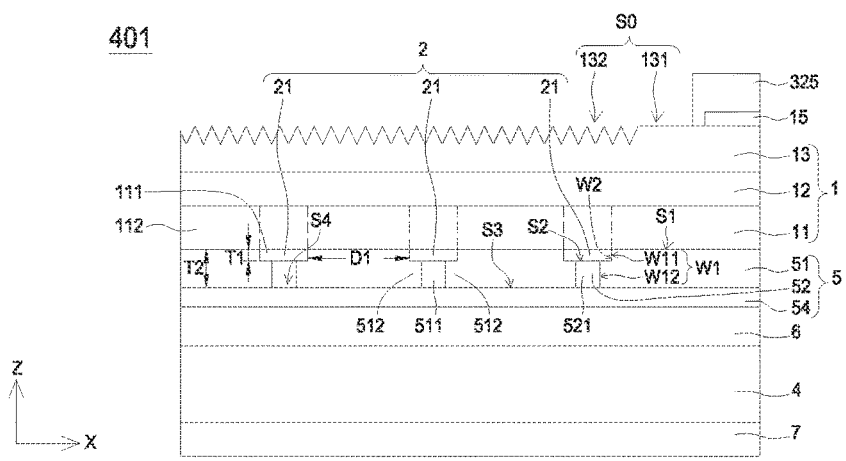
FIG. 4B shows a cross-sectional view of the semiconductor device disclosed in one embodiment in accordance with the present disclosure.

FIG. 4B shows a cross-sectional view of a semiconductor device 401 which is similar to the semiconductor device 400. In this embodiment, the first block 521 of the conductive structure 52 fully fills up the opening 511, and the fourth surface S4 of the conductive structure 52 and the third surface S3 of the dielectric layer 51 are coplanar.

Figure 5A:
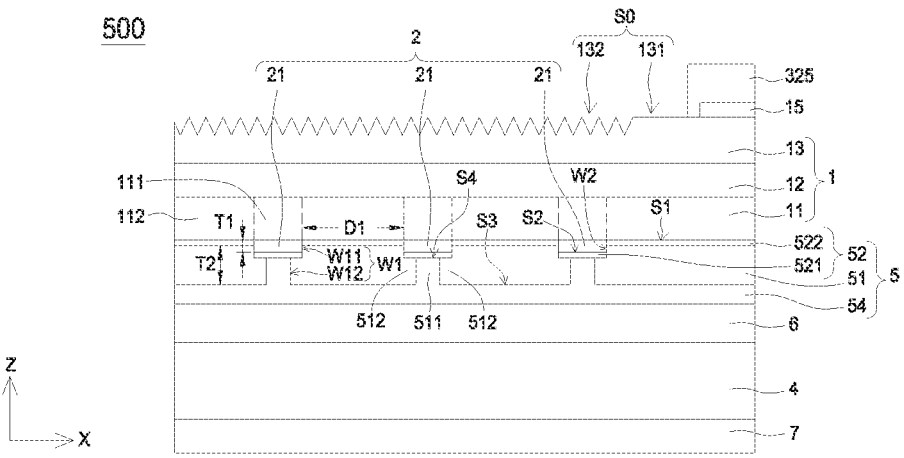
FIG. 5A shows a cross-sectional view of the semiconductor device disclosed in one embodiment in accordance with the present disclosure.

FIG. 5A shows a cross-sectional view of a semiconductor device 500 disclosed in one embodiment in accordance with the present disclosure, and the semiconductor device 500 is similar to the semiconductor device 300. In this embodiment, the conductive structure 52 further includes a plurality of second blocks 522 located between the first semiconductor structure 11 and the dielectric layer 51, and the second blocks 522 contact the first surface S1 of the first semiconductor structure 11. Besides, the first blocks 521 are separated from the second blocks 522 without connection.

Figure 5B:
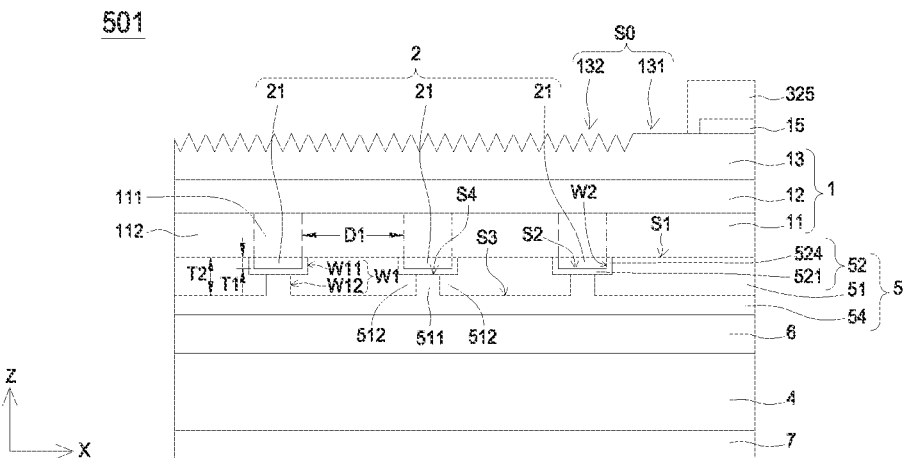
FIG. 5B shows a cross-sectional view of the semiconductor device disclosed in one embodiment in accordance with the present disclosure.

FIG. 5B shows a cross-sectional view of a semiconductor device 501 which is similar to the semiconductor device 300. In this embodiment, the conductive structure 52 further includes a plurality of third blocks 524 covering the second sidewall W2 and connecting the first sidewall W1 and the second sidewall W2, thus the conductive structure 52 contacts a part of the first surface S1. Moreover, the contacting area between the conductive structure 52 and the first surface S1 is smaller than 10% of the first area A1 to reduce the light absorption of the conductive structure 52.

Figure 5C:
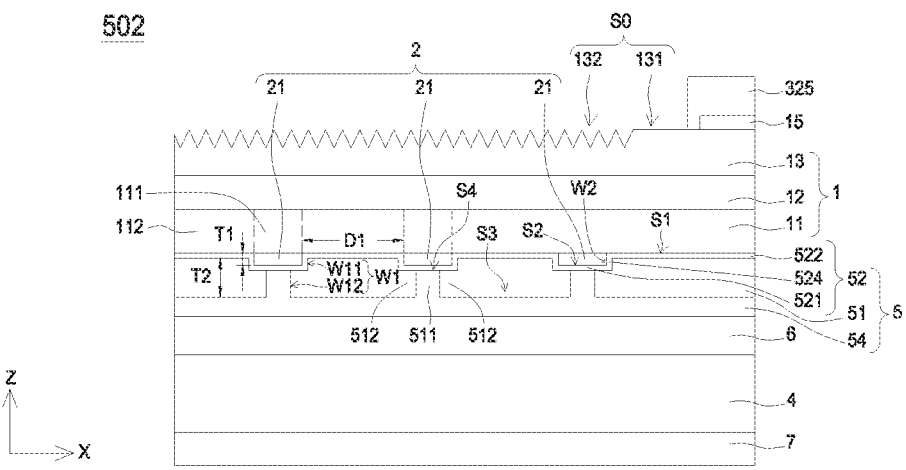
FIG. 5C shows a cross-sectional view of the semiconductor device disclosed in one embodiment in accordance with the present disclosure.

FIG. 5C shows a cross-sectional view of a semiconductor device 502 which is similar to the semiconductor device 300. In this embodiment, the conductive structure 52 includes the first blocks 521, the second blocks 522 and the third blocks 524, and the third blocks 524 connect the first blocks 521 and the second blocks 522. Thus, the conductive structure 52 provides a continuously fitting shape to contacts the first semiconductor structure 11 and the third semiconductor structure 2 to increase the ohmic-contact area and lower the forward voltage. Moreover, in this embodiment, the conductive structure 52 has a contacting area A4' that is approximately equal to the sum of the first area A1 and the sum of areas of all the second sidewalls W2. For instance, when the first part outline 21' is circle (as shown in FIG. TA), total area of all the second sidewalls W2 is equal to perimeter of first part outline 21' times the first thickness T1 times quantity of the first parts 21. Besides, the contacting area A4' is larger than the first area A1 of the first semiconductor structure 11, the second area A2 of the third semiconductor structure 2 or the third area A3 of the openings 511.

Figure 5D:
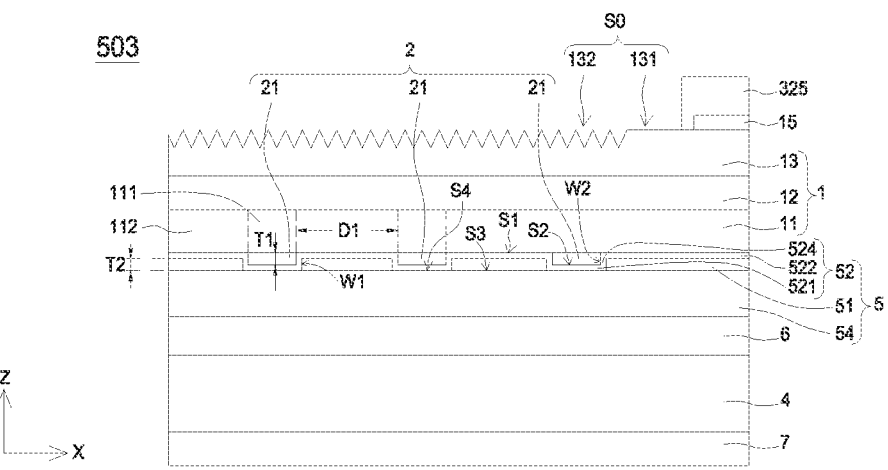
FIG. 5D shows a cross-sectional view of the semiconductor device disclosed in one embodiment in accordance with the present disclosure.

FIG. 5D shows a cross-sectional view of a semiconductor device 503 which is similar to the semiconductor device 502. In this embodiment, the dielectric layer 51 does not include the first regions 512, and the third surface S3 of the dielectric layer 51 and the fourth surface S4 of the conductive structure 52 can be coplanar with each other. In addition, the third surface roughness Ra3 of the third surface S3 is smaller than the fourth surface roughness Ra4 of the fourth surface S4, and both the third surface roughness Ra3 and the fourth surface roughness Ra4 are between 0.1 nm to 1 nm. Thus, the reflecting layer 54 formed afterward can have a lower surface roughness for increasing the reflectivity.

Figure 6A:
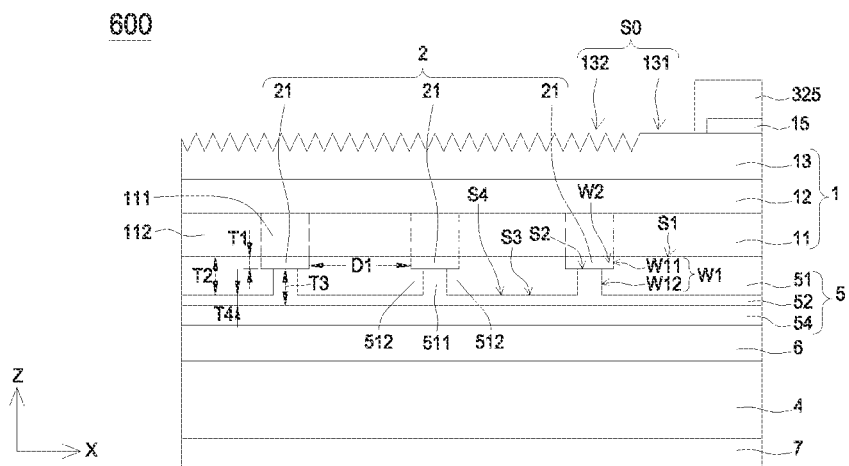
FIG. 6A shows a cross-sectional view of the semiconductor device disclosed in one embodiment in accordance with the present disclosure.

FIG. 6A shows a cross-sectional view of a semiconductor device 600 in one embodiment in accordance with the present disclosure, and the semiconductor device 600 is similar to the semiconductor device 401. In this embodiment, the conductive structure 52 forms an integral thin film structure under the dielectric layer 51 and fills into the plurality of openings 511, and the dielectric layer 51 are separated from the reflecting layer 54 by the conductive structure 52. Besides, the conductive structure 52 has a third thickness T3 and a fourth thickness T4 when respectively corresponding to the first portions 111 and the second portions 112. The third thickness T3 is larger than the fourth thickness T4.

Figure 6B:
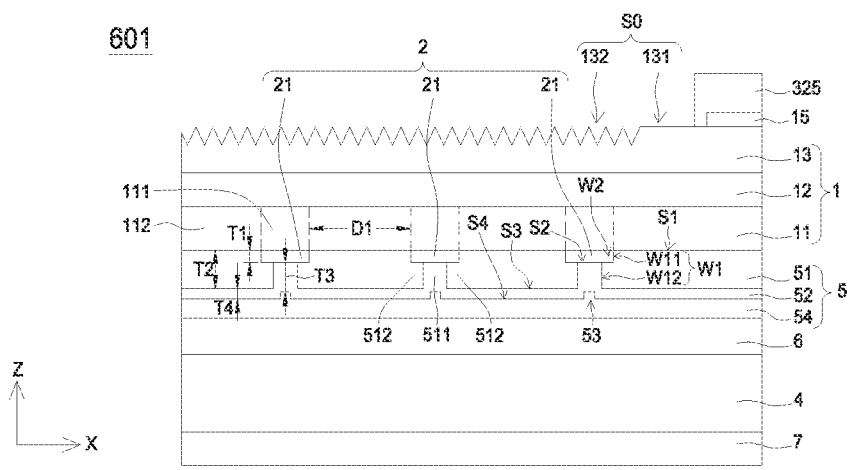
FIG. 6B shows a cross-sectional view of the semiconductor device disclosed in one embodiment in accordance with the present disclosure.

FIG. 6B shows a cross-sectional view of a semiconductor device 601 which is similar to the semiconductor device 600. In this embodiment, the conductive structure 52 further includes a plurality of recesses 53 depressed from the fourth surface S4 towards the first semiconductor stack 1. Locations of the recesses 53 are respectively corresponding to the openings 511 of the dielectric layer 51. In addition, the third thickness T3 is larger than the fourth thickness T4.

Figure 6C:
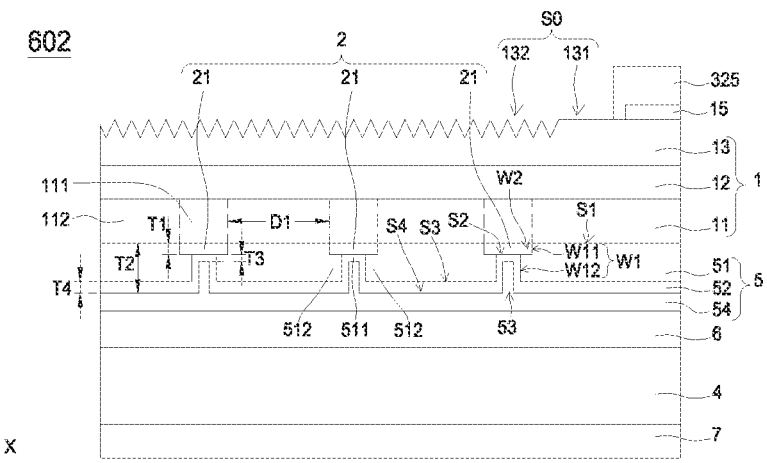
FIG. 6C shows a cross-sectional view of the semiconductor device disclosed in one embodiment in accordance with the present disclosure.

FIG. 6C shows a cross-sectional view of a semiconductor device 602 which is similar to the semiconductor device 601. In this embodiment, the conductive structure 52 fill a portion of each of the openings 511, thus the recesses 53 extend into the openings 511. Besides, the third thickness T3 is smaller than the fourth thickness T4.

Figure 6D:
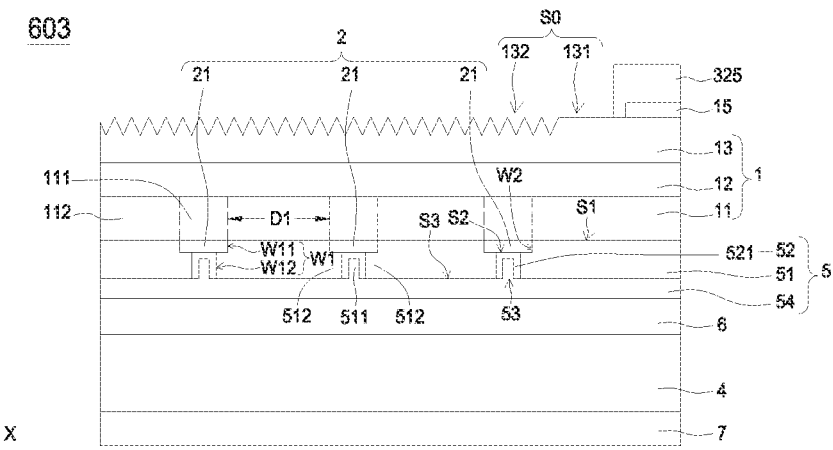
FIG. 6D shows a cross-sectional view of the semiconductor device disclosed in one embodiment in accordance with the present disclosure.

FIG. 6D shows a cross-sectional view of a semiconductor device 603 which is similar to the semiconductor device 602. In this embodiment, the first blocks 521 of the conductive structure 52 is only formed in the openings 511 without exceeding the third surface S3. The conductive structure 52 fill a portion of each of the openings 511 so the recesses 53 are formed and depressed from the third surface S3 towards the first semiconductor stack 1. The reflecting layer 54 fills the recesses 53 and connects the dielectric layer 51 and the conductive structure 52.

Figure 7A:
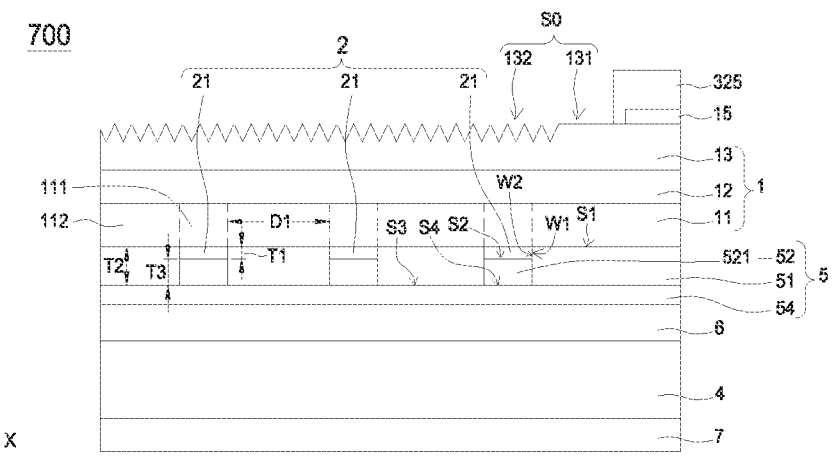
FIG. 7A shows a cross-sectional view of the semiconductor device disclosed in one embodiment in accordance with the present disclosure.

FIG. 7A shows a cross-sectional view of a semiconductor device 700 disclosed in one embodiment in accordance with the present disclosure, and the semiconductor device 700 is similar to the semiconductor device 200. In this embodiment, the horizontal width (along X-axis) of each of the openings 511 is the same as that of each of the first parts 21 while the dielectric layer 51 does not have the first regions 512. The first blocks 521 of the conductive structure 52 fill the openings 511, and the fourth surface S4 of the conductive structure 52 and the third surface S3 of the dielectric layer 51 can be coplanar with each other to reduce the possibility of light diffraction and increasing reflectivity. In other words, the second thickness T2 of the dielectric layer 51 substantially equal to the sum of the first thickness T1 of the third semiconductor structure 2 and the third thickness T3 of the conductive structure 52 (T2=T1+T3).

Figure 7B:
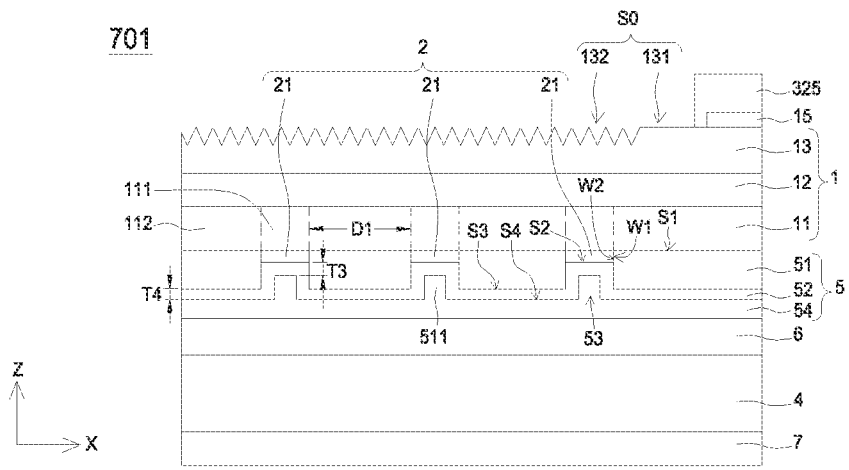
FIG. 7B shows a cross-sectional view of the semiconductor device disclosed in one embodiment in accordance with the present disclosure.

FIG. 7B shows a cross-sectional view of a semiconductor device 701 which is similar to the semiconductor device 602. In this embodiment, the dielectric layer 51 does not have the first regions 512. The conductive structure 52 locates between the dielectric layer 51 and the reflecting layer 54, and fills in the openings 511 to contact the second surface S2 of the third semiconductor structure 2. The recesses 53 are depressed from the fourth surface S4 towards the first semiconductor stack 1 and the locations of the recesses 53 are respectively corresponding to the openings 511. Moreover, for the conductive structure 52, the third thickness T3 is larger than the fourth thickness T4. In one embodiment of the present disclosure, T4 is not larger than 10 nm so the adhesion between the dielectric layer 51 and the reflecting layer 54 is enhanced and the light absorption of the conductive structure 52 is reduced.

Figure 8:
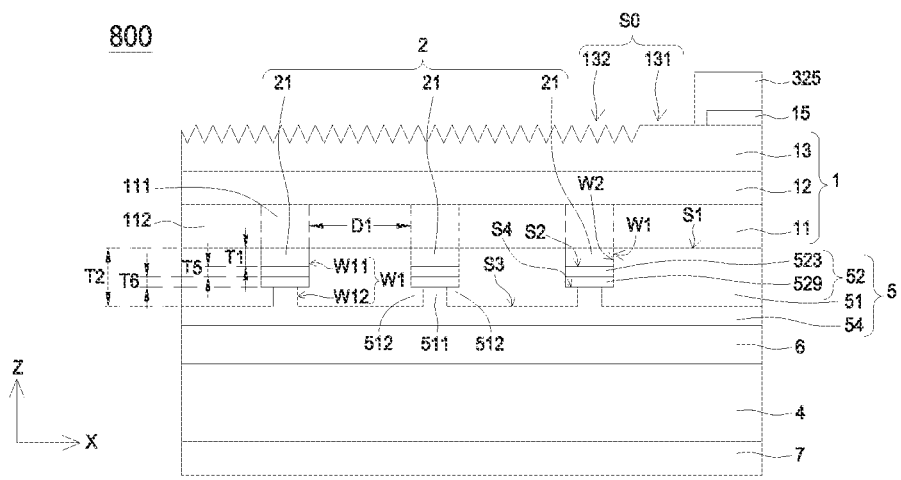
FIG. 8 shows a cross-sectional view of the semiconductor device disclosed in one embodiment in accordance with the present disclosure.

FIG. 8 shows a cross-sectional view of a semiconductor device 800 disclosed in one embodiment in accordance with the present disclosure, and the semiconductor device 800 is similar to the semiconductor device 300. In this embodiment, the conductive structure 52 further includes a first transparent conductive layer 523 and a second transparent conductive layer 529. The first transparent conductive layer 523 is located between the third semiconductor structure 2 and the second transparent conductive layer 529, and the second transparent conductive layer 529 is located between the first transparent conductive layer 523 and the reflecting layer 54. Besides, the first transparent conductive layer 523 can be a material different from that of the second transparent conductive layer 529, e.g., the first transparent conductive layer 523 is composed of Indium Tin Oxide (ITO) and the second transparent conductive layer 529 is composed of Indium Zinc Oxide (IZO). The first transparent conductive layer 523 and the second transparent conductive layer 529 includes metal oxide layer. Along Z-axis, the first transparent conductive layer 523 and the second transparent conductive layer 529 respectively include a fifth thickness T5 and a sixth thickness T6, and the fifth thickness T5 and the sixth thickness T6 can be equal or not. In this embodiment, the fifth thickness T5 is smaller than the sixth thickness T6. In addition, the second thickness T2 of the dielectric layer 51 can be greater or equal to the sum of the fifth thickness T5, the sixth thickness T6 and the first thickness T1 of the third semiconductor structure 2.

Figure 9:
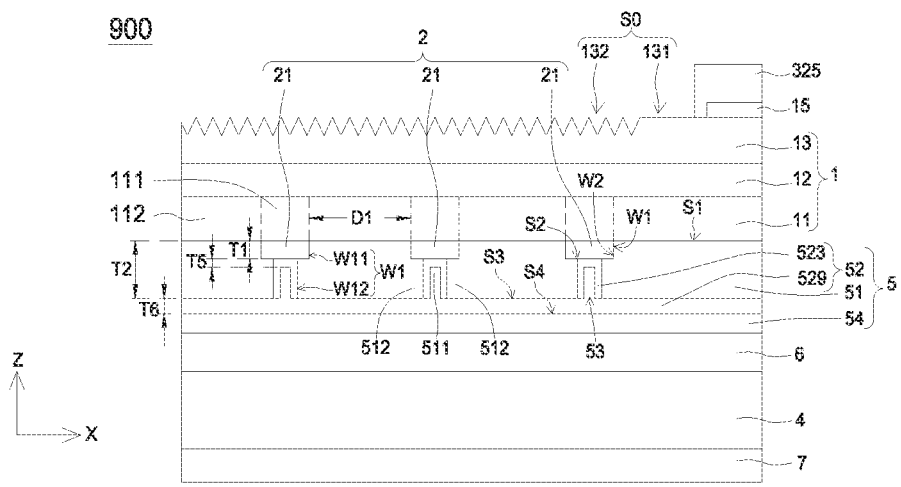
FIG. 9 shows a cross-sectional view of the semiconductor device disclosed in one embodiment in accordance with the present disclosure.

FIG. 9 shows a cross-sectional view of a semiconductor device 900 disclosed in one embodiment in accordance with the present disclosure, and the semiconductor device 900 is similar to the semiconductor device 603. In this embodiment, the conductive structure 52 also includes the first transparent conductive layer 523 and the second transparent conductive layer 529. The first transparent conductive layer 523 is located in the openings 511, and the second transparent conductive layer 529 is located between the first transparent conductive layer 523 and the reflecting layer 54. More specifically, the first transparent conductive layer 523 fills a portion of each of the openings 511 and forms the recesses 53. The second transparent conductive layer 529 fills the recesses 53 and connects with the first transparent conductive layer 523, the dielectric layer 51 and the reflecting layer 54.

Figure 10:
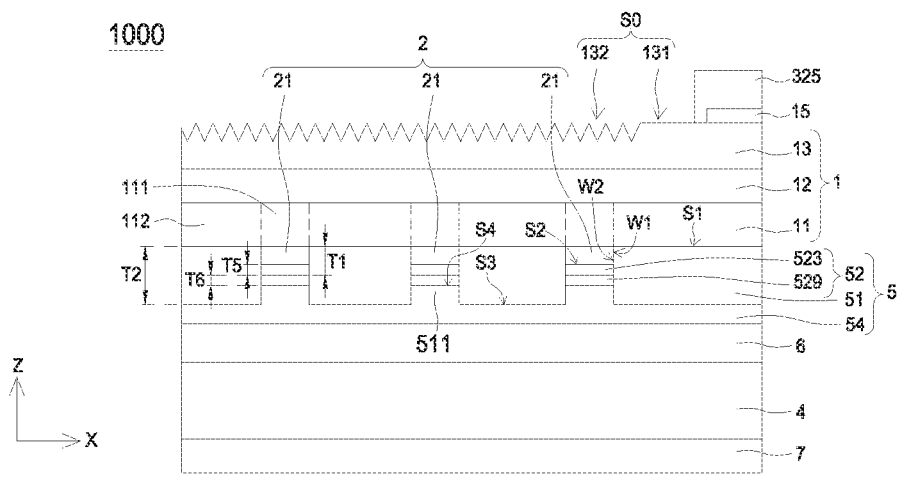
FIG. 10 shows a cross-sectional view of the semiconductor device disclosed in one embodiment in accordance with the present disclosure.

FIG. 10 shows a cross-sectional view of a semiconductor device 1000 which is similar to the semiconductor device 800. In this embodiment, the dielectric layer 51 does not have the first regions 512, and the horizontal width of each of the openings 511 is equal to that of each of the first parts 21. The dielectric layer 51 has a sidewall in contact with the first transparent conductive layer 523 and the second transparent conductive layer 529.

Figure 11:
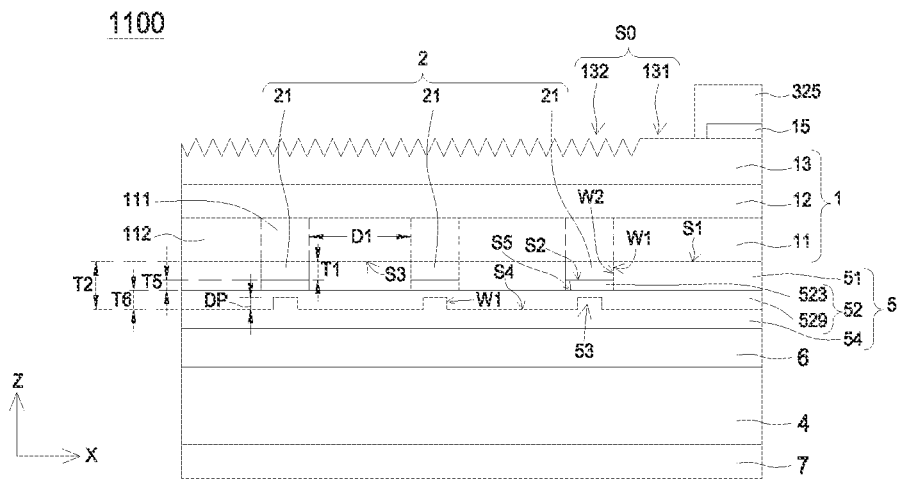
FIG. 11 shows a cross-sectional view of the semiconductor device disclosed in one embodiment in accordance with the present disclosure.

FIG. 11 shows a cross-sectional view of a semiconductor device 1100 which is similar to the semiconductor devices 701 and 800. In this embodiment, the dielectric layer 51 does not have the first regions 512. The first transparent conductive layer 523 is located under the third semiconductor structure 2 and fills the openings 511, and the first transparent conductive layer 523 has a fifth surface S5 which is coplanar with the third surface S3 of the dielectric layer 51. Besides, the second transparent conductive layer 529 is located under the first transparent conductive layer 523 and the dielectric layer 51, and includes the recesses 53 formed with a recess depth DP. The reflecting layer 54 fills the recesses 53 and connects to the second transparent conductive layer 529. Optionally, the recess depth DP can be smaller than the sixth thickness T6 of the second transparent conductive layer 529, or be equal to the sixth thickness T6 to make the first transparent conductive layer 523 be exposed and connected to the reflecting layer 54 directly.

Figure 12:
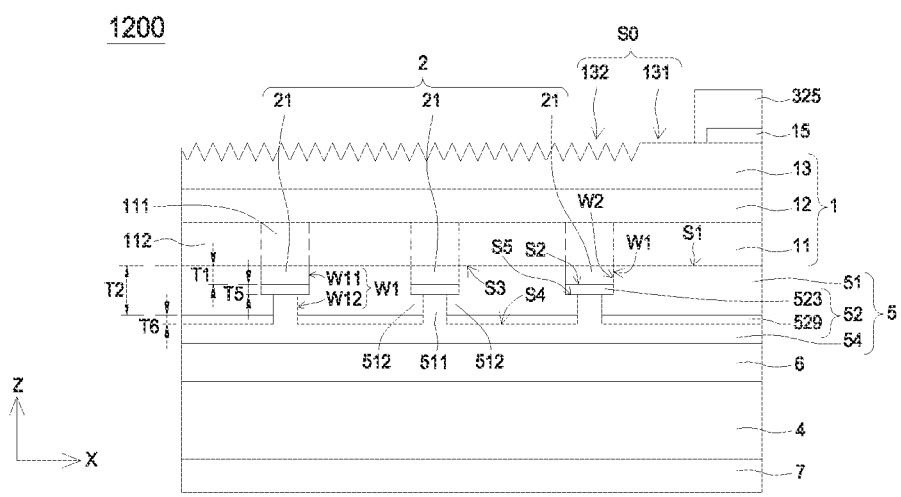
FIG. 12 shows a cross-sectional view of the semiconductor device disclosed in one embodiment in accordance with the present disclosure.

FIG. 12 shows a cross-sectional view of a semiconductor device 1200 which is similar to the semiconductor device 300. In this embodiment, the conductive structure 52 also includes the first transparent conductive layer 523 and the second transparent conductive layer 529, which are separated from each other without connection. More specifically, the first transparent conductive layer 523 is located between the third semiconductor structure 2 and the reflecting layer 54, and the second transparent conductive layer 529 is located between the dielectric layer 51 and the reflecting layer 54. The reflecting layer 54 fills the openings 511 to connect the first transparent conductive layer 523 and to contact the second transparent conductive layer 529. In addition, in vertical direction (along Z-axis), the fifth thickness T5 of the first transparent conductive layer 523 can be larger, equal, or smaller than the sixth thickness T6 of the second transparent conductive layer 529.

Figure 13A:
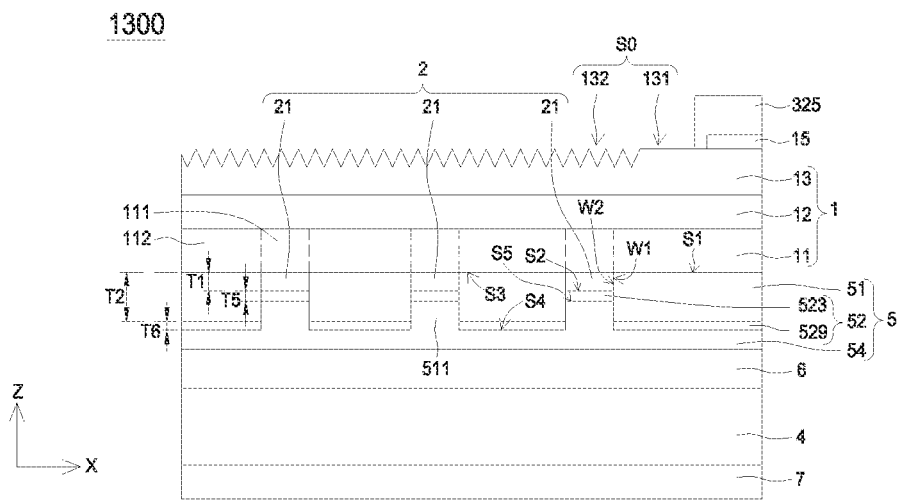
FIG. 13A shows a cross-sectional view of the semiconductor device disclosed in one embodiment in accordance with the present disclosure.

FIG. 13A shows a cross-sectional view of a semiconductor device 1300 disclosed in one embodiment in accordance with the present disclosure, and the semiconductor device 1300 is similar to the semiconductor device 1200. In this embodiment, the dielectric layer 51 does not have the first region 512 for lowering a resistance and enhancing the photoelectric converting efficiency of the semiconductor device 1300. Besides, the second thickness T2 of the dielectric layer 51 is greater than the sum of the fifth thickness T5 of the first transparent conductive layer 523 and the first thickness T1 of the third semiconductor structure 2 (T2>T5+T1). And the sixth thickness T6 of the second transparent conductive layer 529 can be less than 10 nm for providing interface binding effect and lowering light absorption spontaneously.

Figure 13B:
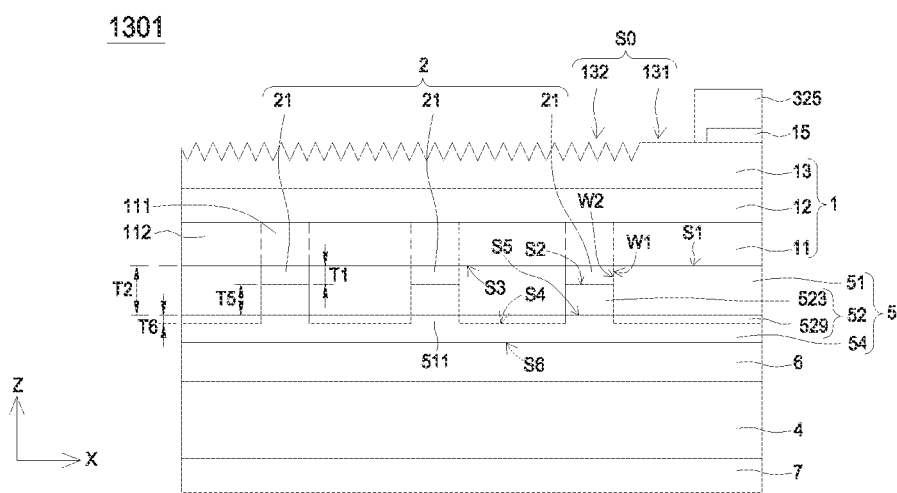
FIG. 13B shows a cross-sectional view of the semiconductor device disclosed in one embodiment in accordance with the present disclosure.

FIG. 13B shows a cross-sectional view of a semiconductor device 1301 which is similar to the semiconductor device 1300. In this embodiment, the first transparent conductive layer 523 fills the openings 511, and the fifth surface S5 of the first transparent conductive layer 523 and the third surface S3 of the dielectric layer 51 can be coplanar. Moreover, the second thickness T2 of the dielectric layer 51 is substantially equal to the sum of the fifth thickness T5 of the first transparent conductive layer 523 and the first thickness T1 of the third semiconductor structure 2 (T2=T5+T1). And the fifth thickness T5 is greater than the sixth thickness T6 of the second transparent conductive layer 529 to provide better ohmic-contact and current spreading effects. In one embodiment, the fifth thickness T5≥10 nm and the sixth thickness T6<10 nm.

FIGS. 13C & 13D respectively show a cross-sectional view and a partially enlarged view of a semiconductor device 1302 which is similar to the semiconductor device 1301. In this embodiment, the recesses 53 are formed on the first transparent conductive layer 523 and depressed from the fifth surface S5 towards first semiconductor stack 1, then the reflecting layer 54 fills the recesses 53 to connect the first transparent conductive layer 523 and the second transparent conductive layer 529. More specifically, the reflecting layer 54 includes a main film body 541, a plurality of first protrudes 541 filled the recesses 53, and a plurality of second protrudes 543 located between the main film body 541 and the first protrudes 542. The width of each of the second protrudes 543 is greater than that of each of the first protrudes 542 but smaller than that of the main film body 541. In vertical direction (along Z-axis), each of the first protrudes 542 and each of the second protrudes 543 respectively have a seventh thickness T7 and an eighth thickness T8. The fifth thickness T5 of the first transparent conductive layer 523 is greater than the seventh thickness T7, and the eighth thickness T8 is substantially equal to the sixth thickness T6 of the second transparent conductive layer 529.

FIGS. 14A and 14B respectively show a top view and an enlarged view of a semiconductor device 1400 disclosed in one embodiment in accordance with the present disclosure, and the semiconductor device 1400 is similar to the semiconductor device 100. In this embodiment, the first part outlines 21' are pentagon and the opening outlines 511' are circle. Referring to FIG. 14B, one first part outline 21' and one opening outline 511' are shown, and the opening outline 511' is disposed in the geometric center of the first part outline 21'. On the X-Y plane, the first part outlines 21' are arranged as an array having at least two columns (along X-axis) and/or at least two rows (along Y-axis). More specifically, the first part outlines 21' are separated from each other by a first distance D1 along Y-axis and by a second distance D2 along X-axis. The first distance D1 is between 0.5 μm to 30 μm, such as 1 μm, 3 μm, 5 μm, 10 μm, 15 μm or 20 μm. The second distance D2 is between 0.5 μm to 10 μm, such as 1 μm, 2 μm, 4 μm, 6 μm or 7 μm. In addition, between two adjacent columns, there can be a column-to-column shifting along Y-axis so the first part outlines 21' form a staggered array, as shown in FIG. 14A. Besides, the opening outlines 511' and the first part outlines 21' respectively have a first perimeter P1 and a second perimeter P2, and the second perimeter P2 is larger than the first perimeter P1. The first perimeter P1 can be between 5 μm to 150 μm, such as 10 μm, 50 μm or 100 μm. The second perimeter P2 can be between 20 μm to 200 μm, such as 10 μm, 50 μm, 100 μm or 150 μm. Moreover, a ratio of the second perimeter P2 to the first perimeter P1 is greater than 0.13 and less than 40, such as 1, 5, 10, 20 or 30, for improving reflectivity and forward voltage spontaneously.

Figures 14C, 14D:
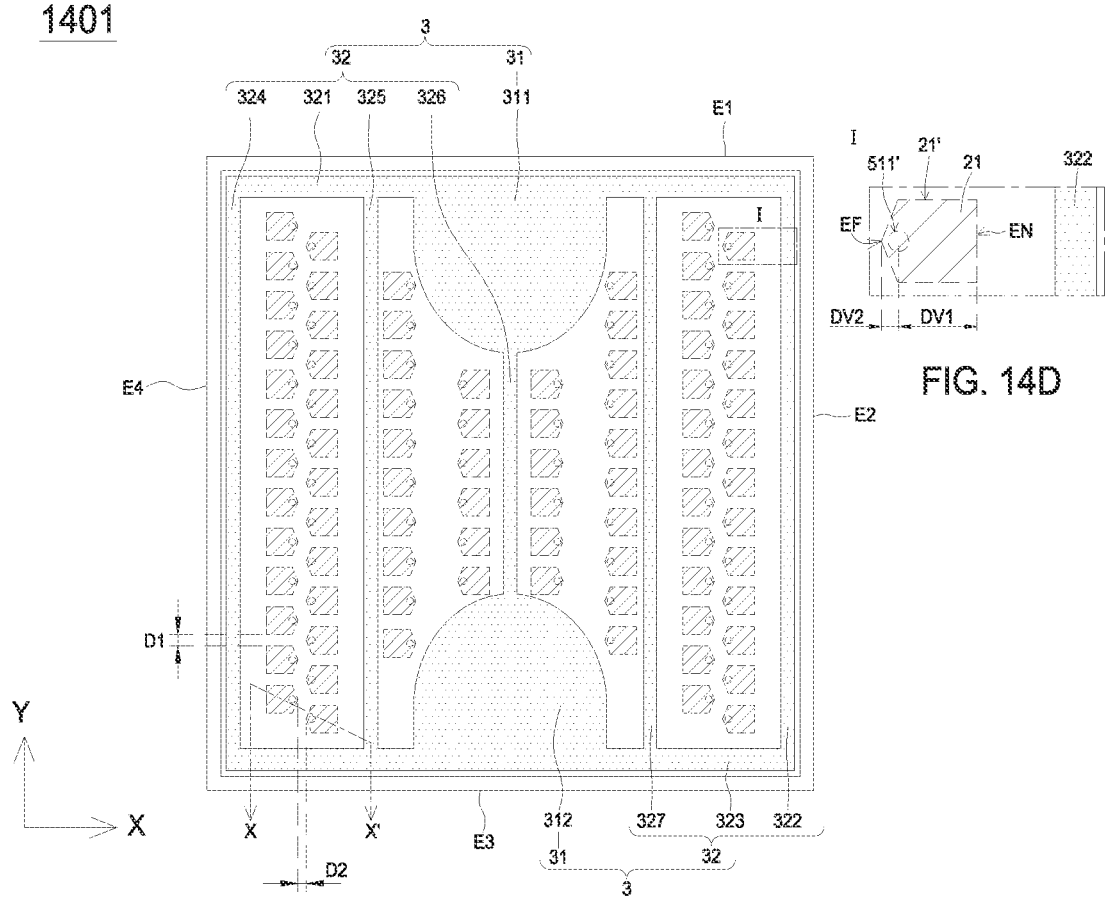
FIG. 14C shows a top view of the semiconductor device disclosed in one embodiment in accordance with the present disclosure.
FIG. 14D shows an enlarged view of region I in FIG. 14C.

FIGS. 14C and 14D respectively show a top view and an enlarged view of a semiconductor device 1401 disclosed in one embodiment in accordance with the present disclosure, and the semiconductor device 1401 is similar to the semiconductor device 1400. On the X-Y plane, the first part outlines 21' are arranged as an array having at least two columns (along X-axis) and/or at least two rows (along Y-axis). The first part outlines 21' and the opening outlines 511' are disposed in one-to-one manner, and their shapes can be a circle or any kinds of polygon. In this embodiment, the first part outlines 21' are arranged as multiple arrays having a unit of two columns and each array is located between two adjacent extension electrodes 32, such as between the fourth extending section 324 and the fifth extending section 325, between the fifth extending section 325 and the sixth extending section 326, between the sixth extending section 326 and the seventh extending section 327 or between the seventh extending section 327 and the second extending section 322. The first part outlines 21' are pentagon and the opening outlines 511' are circle. Besides, the opening outline 511' is not disposed in the geometric center of the first part outline 21'. Referring to the enlarged view of FIG. 14D, along an arrangement direction of the extension electrodes 32, i.e., along X axis, each of the first part outline 21' in the array has a near electrode end EN adjacent to the extension electrodes 32 and a far electrode end EF away from the extension electrodes 32. Each of the opening outlines 511' is located in each of the first part outlines 21' and close to the far electrode end EF. More specifically, there is a first deviation distance DV1 between the center of the opening outline 511' and the near electrode end EN, and a second deviation distance DV2 between center of the opening outline 511' and the far electrode end EF, and the second deviation distance DV2 is smaller than the first deviation distance DV1. In one embodiment, a ratio of the second deviation distance DV2 to the first deviation distance DV1 is greater than 0 and less than 1, and the second deviation distance DV2 can be between 5 μm to 10 μm. Compared with the semiconductor device 1400 of FIG. 14A, the opening outlines 511' in this embodiment are closer to the middle of two adjacent extension electrodes 32. Through such disposition, the uniformity of current spreading is improved and light absorption by the extension electrodes 32 is reduced so that the semiconductor device 1401 has better light-emitting performance.

FIGS. 15A and 15B respectively show a top view and an enlarged view of a semiconductor device 1500 disclosed in one embodiment in accordance with the present disclosure, and the semiconductor device 1500 is similar to the semiconductor device 1400. In this embodiment, the first part outlines 21' are rectangle. The opening outlines 511' are circle and correspondingly disposed in the geometric center of the first part outlines 21'.

Also referring to FIG. 15C for another enlarged view of FIG. 15A. The third semiconductor structure 2 of the semiconductor device 1500 further includes a plurality of second parts 25, and the second parts 25 have a plurality of second part outlines 25' when projected to the X-Y plane. The second part outlines 25' can be parallelogram. As shown in FIGS. 15A, 15B and 15C, in the array of the first part outlines 21', the second part outlines 25' connect the first part outlines 21' located in two adjacent columns. More specifically, the two staggered first part outlines 21' respectively located in two adjacent columns can be connected by the second part outlines 52'. Two adjacent first part outlines 21' in the same columns are separated by a first distance D1 along Y-axis, and the first distance D1 is between 1 μm to 30 μm, such as 5 μm, 10 μm, 15 μm, 20 μm or 25 μm. Besides, each of the first part outlines 21' has a first length L1 on the edge away from the second part outlines 25', and each of the second part outlines 25' has a second length L2 on the edge connected to the first part outlines 21'. The first length L1 is greater than the second length L2 or, more precisely, is two times greater than the second length L2. The first length L1 can be between 1 μm to 30 μm, such as 5 μm, 10 μm, 15 μm, 20 μm or 25 μm.

FIG. 15D shows a cross-sectional view of the semiconductor device 1500 along X-X' line shown in FIG. 15A. The first parts 21 are connected by the second parts 25, and the openings 511 are located under the first parts 21. With the second parts 25, resistance of the semiconductor device 1500 can be further reduced to obtain better photoelectric converting efficiency.

FIGS. 16A and 16B respectively shows a top view and an enlarged view of a semiconductor device 1600 disclosed in one embodiment in accordance with the present disclosure, and the semiconductor device 1600 is similar to the semiconductor device 1400. In this embodiment, the first part outlines 21' are hexagon and the opening outlines 511' are circle. Referring to FIG. 16B, one first part outline 21' and one opening outline 511' are shown, and the opening outline 511' is disposed in the geometric center of the first part outline 21'. On the X-Y plane, the first part outlines 21' are arranged as an array having at least two columns along X-axis and/or at least two rows along Y-axis. The first part outlines 21' are separated from each other by a first distance D1 along Y-axis and by a second distance D2 along X-axis. The first distance D1 is between 0.5 μm to 30 μm, such as 1 μm, 3 μm, 5 μm, 10 μm, 15 μm or 20 μm. The second distance D2 is between 0.5 μm to 10 μm, such as 1 μm, 2 μm, 4 μm, 6 μm or 7 μm.

In this embodiment, the third semiconductor structure 2 of the semiconductor device 1600 further includes a plurality of third parts 26 connecting the first parts 21 to the extension electrodes 32. The third parts 26 can be connected to the first parts 21 by one-to-one correspondence to form an array, or by many-to-one correspondence alternatively. The third parts 26 have a plurality of third part outlines 26' when projected to the X-Y plane, and the third part outlines 26' are all rectangle. The third part outlines 26' are separated from each other by a third distance D3 along Y-axis, and the third distance D3 is between 0.5 µm to 30 µm, such as 1 µm, 3 µm, 5 µm, 10 µm, 15 µm or 20 µm. Moreover, the third part outlines 26' have a long edge parallel to the first edge E1 or the third edge E3, and have a third length L3 on the edge connected to the first part outlines 21'. The third length L3 can be between 1 µm to 20 µm, such as 5 µm, 10 µm or 15 µm. Besides, the first part outlines 21' are regular hexagon and have a fourth length L4 which is between 1 µm to 30 µm, such as 5 µm, 10 µm, 15 µm, 20 µm or 25 µm. Furthermore, the third length L3 is smaller than the fourth length L4.

FIG. 16C shows a cross-sectional view of the semiconductor device 1600 along X-X' line shown in FIG. 16A. In this embodiment, the third parts 26 can be located under the extension electrodes 32 of the first electrode 3, i.e., the third part outlines 26' and the extension electrodes 32 can be overlapped on X-Y plane. Through disposing the third parts 26, resistance of the semiconductor device 1600 can be further reduced to obtain better photoelectric converting efficiency.

For all the semiconductor devices 100 to 1600 mentioned above, the semiconductor stack 1 can optionally include a window layer disposed on the second semiconductor structure 13, and the outer surface S0, the flat area and the rough area 132 can be formed on the window layer. Lights generated by the active structure 12 can transmit the window layer, i.e., energy gap of the window layer is larger than that of the active structure 12. The window layer can be III-V compound semiconductor, such as GaAs, InGaAs, AlGaAs, AlInGaAs, GaP, InGaP, AlInP, AlGaInP, GaN, InGaN, AlGaN, AlInGaN, AlAsSb, InGaAsP, InGaAsN or AlGaAsP.

For all the semiconductor devices 100 to 1600 mentioned above, the contact structure 15 can be made by metal, alloy, or semiconductor. The metal can be Au, Ag, Ge, or Be. The alloy includes the combination of the above metal elements. The semiconductor includes III-V compound semiconductor, such as GaAs, AlGaAs, or GaP.

For all the embodiments mentioned above, doping element can be Si, C, Se, Tw, Zn, Mg or Be.

For all the embodiments mentioned above, all the semiconductor devices 100 to 1600 can be vertical-type and the substrate 4 can be conductive materials, including metals, alloys, metal oxides, semiconductors or carbonaceous materials. The metals can include but not limited to Cu, Al, Cr, Sn, Au, Ni, Ti, Pt, Pb, Zn, Cd, Sb, Mo, W or Co. The alloys can include any of the metal which is mentioned above. The metal oxides can include but not limited to ITO, InO, SnO, CTO, ATO, AZO, ZTO, GZO, IWO, ZnO, IZO, $Ga_2O_3$, $LiGaO_2$, $LiAlO_2$ or $MgAl_2O_4$. The semiconductors can include but not limited to I-V semiconductors or III-V semiconductors, such as Si, Ge, SiC, GaN, AlN, GaP, GaAs, AsGaP, ZnSe or InP. The carbonaceous materials include but not limited to diamond-like carbon (DLC) or graphene.

For all the embodiments mentioned above, the first electrode 3 and the second electrode 7 can include metals or alloys. For example, the metals can include but not limited to Al, Cr, Cu, Sn, Au, Ni, Ti, Pt, Pb, Zn, Cd, Sb or Co. The alloys can include the material in the abovementioned metals.

For all the embodiments mentioned above, the dielectric layer 51 or the barrier layer B includes nonconductive materials, such as organic or inorganic materials. The organic materials include but not limited to $Su_8$, benzocyclobutene (BCB), perfluorocyclobutyl (PFCB), epoxy, acrylic resin, cyclo olefin copolymer (COC), PMMA, PET, PC, polyetherimide or fluorocarbon polymer. The inorganic materials include but not limited to silicon, glass, $Al_2O_3$, $SiN_x$, $SiO_x$, $TiO_x$ or $MgF_x$. In one embodiment, the dielectric layer 51 includes a single layer or multiple layers, which can be a distributed Bragg reflector (DBR) structure constituted by two sub-layers stacking alternately, for example. The sub-layers can be $SiO_x$, $TiO_x$ or $MgF_2$.

For all the embodiments mentioned above, the conductive structure 52, the first transparent conductive layer 523 and the second transparent conductive layer 529 are transmittable for lights emitted from the active structure 12 and can include metal oxides. The metal oxides can include but not limited to ITO, InO, SnO, CTO, ATO, AZO, ZTO, GZO, IWO, ZnO, MgO or IZO.

For all the embodiments mentioned above, the reflecting layer 54 can include metals or alleys. The metals can include but not limited to Cu, Al, Sn, Au, Ag, Pb, Ti, Ni, Pt, or W. The alloys can include any abovementioned metals.

For all the embodiments mentioned above, the bonding layer 6 includes conductive materials, such as metal oxides, semiconductors, metals, alloys or carbonaceous materials. The metal oxides can include ITO, InO, SnO, CTO, ATO, AZO, ZTO, GZO, ZnO, indium cerium oxide (ICO), IWO, indium titanium oxide (ITiO), IZO, indium gallium oxide (IGO) or gallium and aluminum codoped zinc oxide (GAZO). The semiconductors include but not limited to GaP. The metals can include Cu, Al, Sn, Au, Ag, Pb, Ti, Ni, In, Pt or W. The alloys can include the aforementioned metal materials. The carbonaceous materials can include graphene. The bonding layer 6 can connect the substrate 4 to the reflecting structure 5 and can have a plurality of sub-layers (not shown).

The embodiments of the present disclosure will be described in detail below with reference to the drawings. In the descriptions of the specification, specific details are provided for a full understanding of the present disclosure. The same or similar components in the drawings will be denoted by the same or similar symbols. It is noted that the drawings are for illustrative purposes only and do not represent the actual dimensions or quantities of the components. Some of the details may not be fully sketched for the conciseness of the drawings.

What is claimed is:

1. A semiconductor device, comprising:
   a semiconductor stack comprising a first semiconductor structure, an active structure and a second semiconductor structure, wherein the first semiconductor structure includes a first surface, the first surface has a first area and comprising a first portion and a second portion;
   a third semiconductor structure connected to the first portion and including a second surface with a second area;
   a dielectric layer connected to the second portion, and comprising a plurality of openings having a third area; and
   a reflecting layer located on one side of the third semiconductor structure opposite to the first semiconductor structure;
   wherein a ratio of the second area of the third semiconductor structure to the first area of the first surface is in a range of 0.1 to 0.7, and a ratio of the third area of the openings to the first area of the first surface is less than 0.2.

2. The semiconductor device according to claim 1, wherein the reflecting layer is filled in the openings to connect the third semiconductor structure.

3. The semiconductor device according to claim 1, wherein the dielectric layer and the third semiconductor structure have the same thickness.

4. The semiconductor device according to claim 1, further comprising a conductive structure filled in the openings to connect the third semiconductor structure.

5. The semiconductor device according to claim 4, wherein the conductive structure is located between the third semiconductor structure and the dielectric layer, and the second surface of the third semiconductor structure contacts the conductive structure.

6. The semiconductor device according to claim 5, wherein the conductive structure further contacts the first semiconductor structure, and a contacting area between the conductive structure and the first semiconductor structure is less than 10% of the first area.

7. The semiconductor device according to claim 4, wherein the conductive structure has a fourth area, and the fourth area is substantially equal to the second area of the third semiconductor structure.

8. The semiconductor device according to claim 4, wherein the conductive structure has a fourth area, and the fourth area is substantially equal to the third area of the openings.

9. The semiconductor device according to claim 4, wherein the dielectric layer has a thickness substantially equal to a sum of thicknesses of the third semiconductor structure and the conductive structure.

10. The semiconductor device according to claim 4, wherein the conductive structure is between the reflecting layer and the dielectric layer, and the reflecting layer and the dielectric layer are separated from each other.

11. The semiconductor device according to claim 4, wherein the dielectric layer and the conductive structure respectively include a third surface and a fourth surface, and the third surface has a surface roughness smaller than that of the fourth surface.

12. The semiconductor device according to claim 1, further comprising a conductive structure located between the first semiconductor structure and the dielectric layer.

13. The semiconductor device according to claim 1, wherein the third semiconductor structure comprises a plurality of first parts separated from each other by a first distance, and the first distance is less than 20 μm.

14. The semiconductor device according to claim 1, wherein the third semiconductor structure comprises a plurality of first parts and a plurality of second parts, and the first parts are connected by the second parts.

15. The semiconductor device according to claim 1, further comprising a metal oxide layer, wherein the metal oxide layer is between the dielectric layer and the reflecting layer.

16. A semiconductor device, comprising:
a semiconductor stack comprising a first semiconductor structure, an active structure and a second semiconductor structure, wherein the first semiconductor structure includes a first surface, the first surface comprising a first portion and a second portion;
a third semiconductor structure connected to the first portion and including a plurality of first parts;
a dielectric layer connected to the second portion, and comprising a plurality of openings;
a reflecting layer located on one side of the third semiconductor structure opposite to the first semiconductor structure; and
a first transparent conductive layer located between the third semiconductor structure and the dielectric layer and connecting the third semiconductor structure;
wherein the first transparent conductive layer connects one of the first parts, and the first transparent conductive layer has a width smaller than that of the one of the first parts.

17. The semiconductor device according to claim 16, further comprising a second transparent conductive layer located between the first transparent conductive layer and the reflecting layer, wherein the second transparent conductive layer connects the dielectric layer.

18. The semiconductor device according to claim 17, wherein the reflecting layer fills the openings.

19. The semiconductor device according to claim 16, further comprising a second transparent conductive layer located between the first transparent conductive layer and the reflecting layer, wherein the second transparent conductive layer fills the openings to connect the first transparent conductive layer.

20. The semiconductor device according to claim 19, wherein the dielectric layer has a sidewall covered by the second transparent conductive layer.

\* \* \* \* \*